(12) United States Patent
Ono et al.

(10) Patent No.: US 8,546,804 B2
(45) Date of Patent: Oct. 1, 2013

(54) SEMICONDUCTOR DEVICE INCLUDING A REGION CONTAINING NITROGEN AT AN INTERFACE AND DISPLAY DEVICE

(75) Inventors: Takeshi Ono, Tokyo (JP); Naoki Nakagawa, Tokyo (JP); Yusuke Yamagata, Tokyo (JP); Kazunori Inoue, Kumamoto (JP); Nobuaki Ishiga, Kumamoto (JP); Kensuke Nagayama, Kumamoto (JP); Naoki Tsumura, Kumamoto (JP); Toru Takeguchi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 113 days.

(21) Appl. No.: 13/232,251

(22) Filed: Sep. 14, 2011

(65) Prior Publication Data
US 2012/0112194 A1 May 10, 2012

(30) Foreign Application Priority Data

Nov. 5, 2010 (JP) ................................ 2010-248323
May 24, 2011 (JP) ................................ 2011-115367

(51) Int. Cl.
*H01L 29/04* (2006.01)
*H01L 29/10* (2006.01)
*H01L 31/00* (2006.01)
*G02F 1/136* (2006.01)

(52) U.S. Cl.
USPC .......... 257/57; 257/59; 257/E33.053; 349/41; 349/42; 349/43; 349/44; 349/45; 349/46

(58) Field of Classification Search
None
See application file for complete search history.

(56) References Cited

U.S. PATENT DOCUMENTS

| 7,411,298 B2 | 8/2008 | Kawakami et al. |
| 7,825,515 B2 | 11/2010 | Inoue et al. |
| 7,915,062 B2 | 3/2011 | Yano et al. |
| 2004/0022664 A1 | 2/2004 | Kubota et al. |
| 2007/0096098 A1 | 5/2007 | Ishiga et al. |
| 2009/0065942 A1* | 3/2009 | Inoue et al. .................. 257/765 |
| 2009/0108264 A1* | 4/2009 | Inoue et al. .................... 257/59 |
| 2010/0148175 A1* | 6/2010 | Godo et al. ..................... 257/57 |

FOREIGN PATENT DOCUMENTS

| JP | 6-236893 | 8/1994 |
| JP | 7-30118 | 1/1995 |
| JP | 8-62628 | 3/1996 |
| JP | 2003-89864 | 3/2003 |
| JP | 2008-10801 | 1/2008 |
| JP | 2009-16862 | 1/2009 |
| JP | 2009-94325 | 4/2009 |

* cited by examiner

*Primary Examiner* — N Drew Richards
*Assistant Examiner* — Michael Jung
(74) *Attorney, Agent, or Firm* — Oblon, Spivak, McClelland, Maier & Neustadt, L.L.P.

(57) ABSTRACT

It is an object to provide a technique to improve electric characteristics after a high-temperature treatment even when a high melting point metal barrier layer is not formed. A semiconductor device includes a gate electrode formed on a transparent insulation substrate, a semiconductor layer having a Si semiconductor active film and an ohmic low resistance Si film having an n-type conductivity, being formed in this order on the gate electrode with a gate insulation film interposed between the gate electrode and the semiconductor layer, and the source and drain electrodes directly connected to the semiconductor layer and containing at least aluminum (Al). At least nitrogen (N) is contained in a first region that is in the vicinity of an interface between a side surface of the SI semiconductor active film and the source and drain electrodes.

17 Claims, 19 Drawing Sheets

F I G . 1
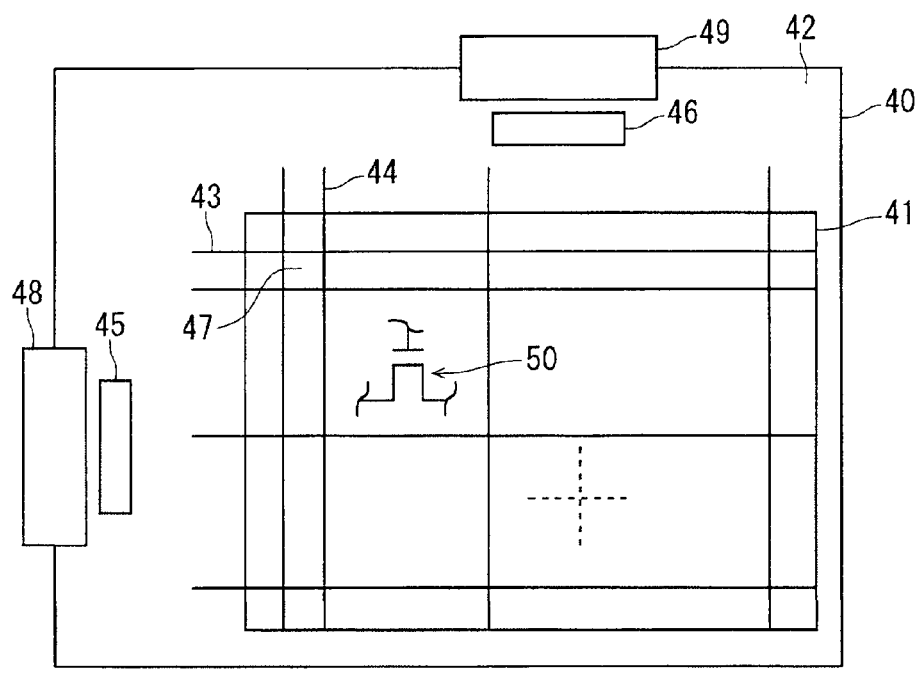

SEMICONDUCTOR DEVICE INCLUDING A REGION CONTAINING NITROGEN AT AN INTERFACE AND DISPLAY DEVICE

BACKGROUND OF THE INVENTION

1. Field of the Invention

The present invention relates to a semiconductor device and a display device such as an electro-optic display having the same.

2. Description of the Related Art

There is an active matrix type thin film transistor (hereinafter, referred to as the TFT) serving as a switching element in a semiconductor device, and there is an electro-optic display device for the display device (such as a liquid crystal display device or an EL (Electro-Luminescence) display device) having the TFT. Since the electro-optic display device has characteristics of low power consumption and being thin, it is increasingly applied to a product as a flat panel display, instead of a CRT (Cathode Ray Tube).

Recently, brightness of a backlight increases, a TV screen becomes large, and definition of a small display becomes high in a mobile computer such as a mobile phone, so that the backlight is required to be further shielded in a TFT structure, and resistance of a line material of a semiconductor device for the display device is required to be further lowered.

A detailed description will be made of the backlight shielding in the TFT structure. According to a conventionally used TFT structure, a Si semiconductor layer including various kinds of silicon (Si) semiconductor films extrudes from an outer periphery of a gate electrode in a planar view. However, as the brightness of the backlight increases, a light leak current increases in the Si semiconductor layer, so that it is proposed that the Si semiconductor layer is prevented from being irradiated with light by arranging the Si semiconductor layer on an inner side of the gate electrode.

Next, a detailed description will be made of the lowering of the resistance in the line material. As a line material of the semiconductor device for the conventional display device, a high melting point metal material such as metal of titanium (Ti), chrome (Cr), molybdenum (Mo), tantalum (Ta), or tungsten (W) or an alloy mainly including the above metals is used in general. The above high melting point metal material is preferably used as the electrode material for the semiconductor device because an interface diffusion reaction is hardly generated in a connection interface with the Si semiconductor layer. However, since a specific resistance value of the high melting point metal material is 12 to 60 μΩ·cm in general, the high melting point metal material is not suitable for the electrode material for the semiconductor device under present circumstances.

Thus, aluminum (Al) or an aluminum-based alloy attract attention as the line material of the semiconductor device for the display device because the alloy is low in specific resistance and can be easily patterned into the line.

However, it is widely known that an Al film and an Al alloy film (hereinafter, referred to as the "Al alloy film and the like") cause an excessive mutual diffusion reaction in a connection interface with a Si semiconductor film or a Si-based film (hereinafter, referred to as the "Si semiconductor film and the like") and thus its electric characteristics deteriorate. Therefore, in the case where the Al alloy film and the like and the Si semiconductor film and the like are electrically connected, it is proposed that a burrier layer including the above high melting point metal material (hereinafter, referred to as the "high melting point metal burrier layer") is interposed between them to prevent the electric characteristics from deteriorating.

In addition, in the electro-optic display device for the display device, an indium oxide series film generally used as its transparent pixel electrode material, such as an ITO (Indium Tin Oxide) film including indium oxide and tin oxide is connected to a line film (such as an Al alloy film). However, since the same interface diffusion reaction as that with the above Si semiconductor film is caused in a connection interface between the Al alloy film and the ITO film, it is proposed that the high melting point metal burrier layer is interposed between the Al alloy film and the transparent pixel electrode, similar to the above when they are electrically connected.

Each of Japanese Patent Application Laid-Open No. 6-236893, Japanese Patent Application Laid-Open No. 7.30118, and Japanese Patent Application Laid-Open No. 8-62628 discloses a technique to interpose the high melting point metal burrier layer between the low resistance Al alloy film and the like serving as the source and drain electrodes, and the Si semiconductor film and the like, as one example of the above technique. According to the technique, the low resistance Si film in which an impurity is added to Si (hereinafter, referred to as the "ohmic low resistance Si film") or the ITO film is directly connected to the high melting point metal burrier layer including Cr, Mo, Ti, or Zr (zirconium) and then a low resistance Al series metal is formed on the high melting point metal burrier layer.

Each of Japanese Patent Application Laid-Open No. 2003-89864 and Japanese Patent Application Laid-Open No. 2008-10801 also discloses a configuration to prevent the interface diffusion reaction in the interface between the Al alloy film and the ITO or Si to obtain preferable electric characteristics (contact characteristics) of the interface, similar to the above technique. More specifically, Japanese Patent Application Laid-Open No. 2003-89864 discloses a technique to improve the contact characteristics by directly connecting an Al alloy film containing a predetermined amount of nickel (Ni) to each of the ITO film and the Si semiconductor film. In addition, Japanese Patent Application Laid-Open No. 2008-10801 discloses a technique in which an AlNi alloy film is used as the Al alloy film to improve the contact characteristics between the AlNi alloy film and the ITO film. In addition, Japanese Patent Application Laid-Open No. 2008-10801 discloses a technique in which a SiAlNi alloy film is connected to the Si semiconductor film with a layer containing nitrogen (N) in Si interposed therebetween to improve the contact characteristics between them. With the techniques disclosed in Japanese Patent Application Laid-Open No. 2003-89864 and Japanese Patent Application Laid-Open No. 2008-10801, at least a step of forming the high melting point metal burrier layer between the Al alloy films, and the ITO film or the Si semiconductor film can be omitted.

However, according to Japanese Patent Application Laid-Open No. 6-236893, Japanese Patent Application Laid-Open No. 7-30118, and Japanese Patent Application Laid-Open No. 8-62628, the high melting point metal burrier layer is formed to prevent the diffusion reaction in the interface between the Al alloy film and the like and the Si semiconductor film and the like, so that more steps of forming and etching the film are needed, which complicates a production process. As a result, the problem is that production capability is lowered. In addition, since unevenness is generated in a shape of an etched cross-section due to a difference in etching speed between the Al alloy film and the high melting point metal material, and due to a difference in side etching amount proceeding in a lateral direction at the time of etching, so that fine work is difficult to perform. Furthermore, the unevenness in the shape of the etched cross-section causes deterioration in coverage characteristics of a film formed as an upper layer. Thus, regarding the structure and method to interpose the high melting point metal burrier layer between the Al alloy film and the like and the Si semiconductor film and the like, it is difficult to produce the semiconductor device having high quality and high reliability.

In addition, when the techniques of Japanese Patent Application Laid-Open No. 2003-89864 and Japanese Patent Application Laid-Open No. 2008-10801 are used, the inventors of the present invention have found that there is a defect in an on current ($I_{on}$) that is a current flowing at an on time of a switching operation and an off current ($I_{off}$) that is a leak current flowing at off time thereof.

More specifically, a Si semiconductor layer including the above ohmic low resistance Si film doped with phosphorus, and a Si semiconductor film in which a channel is formed based on a gate voltage (hereinafter, referred to as the "Si semiconductor active film") is wholly or partially arranged in an inner side of the gate electrode so that the Si semiconductor layer is not irradiated with light from the backlight.

Thus, similar to the technique in Japanese Patent Application Laid-Open No. 2003-89864, the AlNi alloy film is directly connected to the Si semiconductor layer, as the source and drain electrodes of the TFT having the Si semiconductor layer, Just after this structure is formed, the mutual diffusion reaction is not recognized in each of the connection interface between the AlNi alloy film and the ohmic low resistance Si film, and the connection interface between the AlNi alloy film and the Si semiconductor active film. However, when this structure is subjected to a heat treatment (held in the air or a nitrogen gas atmosphere for about 30 minutes), the mutual diffusion reaction between Al and Si gradually proceeds, and when it is subjected to a heat treatment under the air or the nitrogen gas atmosphere at a temperature exceeding 250° C., the mutual diffusion reaction is recognized at a light microscopic level.

Meanwhile, when the structure is subjected to a heat treatment at a little lowered temperature (200° C. or more), noticeable mutual diffusion reaction is not recognized at the light microscopic level, but obvious deterioration is recognized in TFT characteristics when the electric characteristics of the TFT (TFT characteristics) are measured. More specifically, one digit or more increase in the above $I_{off}$ is recognized in the general Id (drain current)-Vg (gate voltage) characteristics of the TFT. It is supposed that this is because minute mutual diffusion which cannot be observed at the light microscopic level is partially generated in the connection interface between Al and Si.

Next, in a case where the configuration in which the N containing layer is formed between the AlNi alloy film and the ohmic low resistance Si film as disclosed in Japanese Patent Application Laid-Open No. 2008-10801 is subjected to a heat treatment at 300° C. or more, mutual diffusion reaction is not recognized between them, but mutual diffusion reaction (noticeable deterioration in electric characteristics in the TFT) is recognized in the interface between the AlNi alloy film and the Si semiconductor active film. As a specific phenomenon, $I_{off}$ increases to three digits or more and $I_{on}$ decreases to about 50% of that provided when the high melting point metal burrier layer is formed. In addition, noticeable deterioration is recognized in on characteristics due to the heat treatment. More specifically, as compared to $I_{on}$ just after the structure is formed, $I_{on}$ after the heat treatment at 300° C. decreases to up to 50%.

However, the process for producing the active matrix TFT substrate for the general display device includes a treatment performed at a process temperature of 200° C. or more, or about 300° C. in general. Therefore, the above semiconductor device cannot be substantially used for the display device in view of heat resistance.

SUMMARY OF THE INVENTION

Thus, it is an object of the present invention to provide a technique to improve electric characteristics after a high temperature heat treatment even when a high melting point metal burrier layer is not formed.

According to the present invention, a semiconductor device includes a gate electrode, a semiconductor layer, and source and drain electrodes. The gate electrode is formed on an insulation substrate. The semiconductor layer includes a first amorphous silicon film and a second amorphous silicon film having a predetermined conductivity type, being formed in this order on the gate electrode with a gate insulation film interposed between the gate electrode and the semiconductor layer. The source and drain electrodes contains at least aluminum (Al) that is directly connected to the semiconductor film. The semiconductor film is formed in an inner side of an outer periphery of the gate electrode in a planar view, and at least nitrogen (N) is contained in a first region that is in the vicinity of an interface between a side surface of the first amorphous silicon film and the source and drain electrodes.

Nitrogen (N) is contained in the first region in the vicinity of the interface between the side surface of the first amorphous silicon film and the source and drain electrodes. With this configuration, off characteristics after a high temperature heat treatment can be preferably provided even when the high melting point metal burrier layer is not provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view showing a configuration of an electro-optic display device provided with a semiconductor device according to the present invention;

DESCRIPTION OF THE PREFERRED EMBODIMENTS

Figure 2:
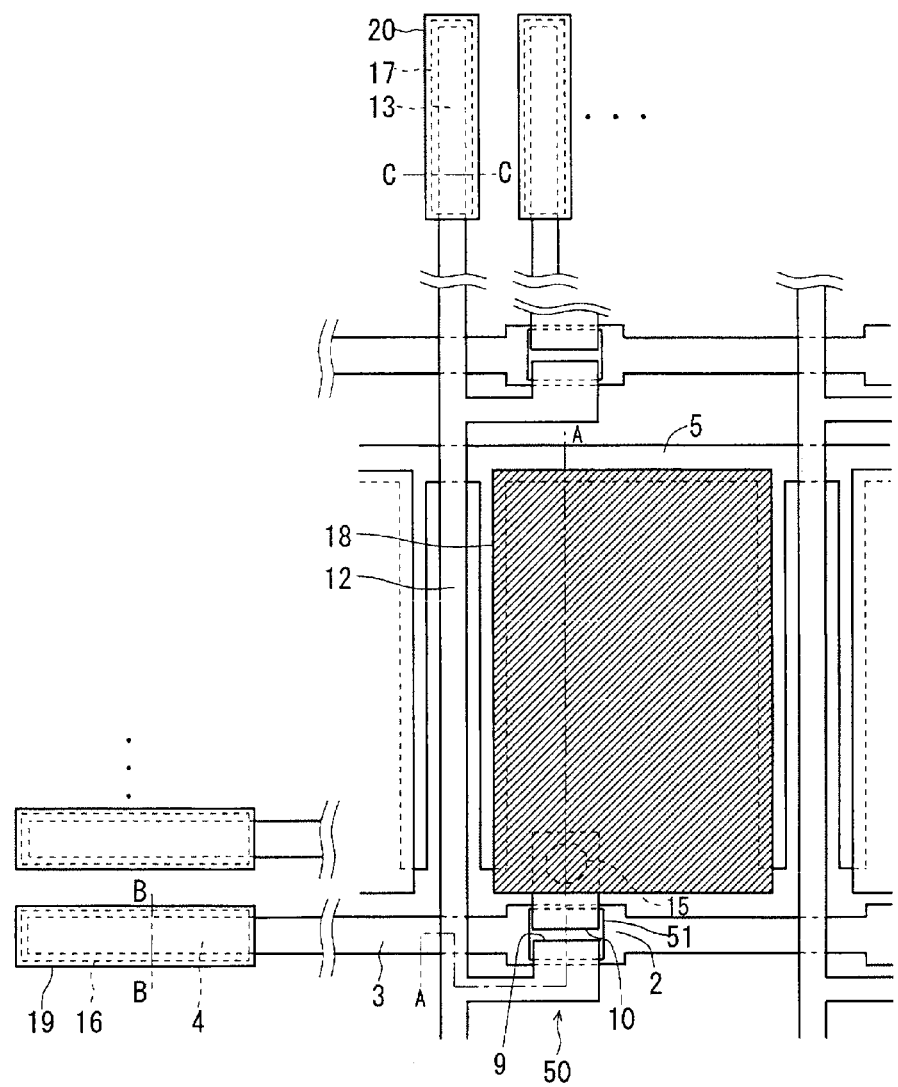
FIG. 2 is a plan view showing a TFT array substrate according to a first preferred embodiment.

<Configuration of Display Device Common to Each Preferred Embodiment>

FIG. 1 is a view schematically showing one example of an electro-optic display device provided with a semiconductor device according to the present invention. Prior to a detailed description of the semiconductor device according to the present invention, a description will be made of the electro-optic display device provided with the semiconductor device with reference to FIG. 1. In addition, hereinafter, the description will be made assuming that the electro-optic display device is a liquid crystal display device, but the present invention is not limited to this, and it may be a flat panel display device such as an organic EL display device.

The liquid crystal display device shown in FIG. 1 includes a substrate 40 on which a TFT 50 serving as the semiconductor device according to the present invention, an opposed substrate (not shown) arranged on a view side of the liquid crystal display device so as to be opposed thereto, and a backlight unit (not shown) arranged on an opposite side of the opposed substrate across the substrate 40. The substrate 40 corresponds to an active matrix type TFT substrate (TFT array substrate), and the opposed substrate corresponds to a color filter substrate.

A display region 41, and a frame region 42 arranged around an outer periphery of the substrate 40 to surround the display region 41 are provided on the substrate 40. A plurality of gate lines (scan signal lines) 43 and a plurality of source lines (display signal lines) 44 are formed in the display region 41. The gate lines 43 are provided so as to be parallel to each other, and the source lines 44 are provided so as to be parallel to each other. The gate line 43 and the source line 44 are formed so as to three-dimensionally cross each other with an insulation film interposed therebetween in a cross-sectional view. In addition, the gate line 43 and the source line 44 are provided so as to be perpendicular to each other in a planar view.

A pixel 47 is formed in a region surrounded by the adjacent gate lines 43 and the adjacent source lines 44. Therefore, the plurality of pixels 47 are arranged in the form of a matrix on the substrate 40.

A scan signal drive circuit 45, and a display signal drive circuit 46 are provided in the frame region 42 of the substrate 40. Each gate line 43 of the display region 41 extends to the frame region 42 and is connected to the scan signal drive circuit 45 in an end of the substrate 40. Similarly, each source line 44 of the display region 41 extends to the frame region 42 and is connected to the display signal drive circuit 46 in an end of the substrate 40. An external line 48 is arranged in the vicinity of the scan signal drive circuit 45 on the side of the end of the substrate 40, and each line of the external line 48 is connected to a corresponding part of the scan signal drive circuit 45. Similarly, an external line 49 is arranged in the vicinity of the display signal drive circuit 46 on the side of the end of the substrate 40, and each line of the external line 49 is connected to a corresponding part of the display signal drive circuit 46. For example, FPC (Flexible Printed Circuit) is used for the external lines 48 and 49.

The scan signal drive circuit 45 and the display signal drive circuit 46 receive various signals supplied from an external part through the external lines 48 and 49, respectively. The scan signal drive circuit 45 supplies a gate signal (scan signal) to the gate line 43, based on an external control signal received by the external line 48. The gate line 43 to which the gate signal is supplied is sequentially selected. Meanwhile, the display signal drive circuit 46 supplies a display signal to the source line 44, based on external display data received by the external line 49. Thus, a display voltage based on the display data is supplied to each pixel 47.

At least one TFT 50 is arranged in the pixel 47. According to this example, it is assumed that the TFT 50 is arranged in the vicinity of a three-dimensional crossing point between the source line 44 and the gate line 43. When the TFT 50 serving as a switching element is turned on in response to the gate signal from the gate line 43, it supplies the display voltage from the source line 44 to the corresponding drain electrode. Thus, the display voltage is supplied to a pixel electrode connected to the drain electrode of the TFT 50. When the display voltage is applied to the pixel electrode, an electric field corresponding to the display voltage is generated between the pixel electrode and an opposed electrode provided on the above-described opposed substrate. In addition, an oriented film (not shown) is arranged on the surface of the substrate 40.

The above opposed substrate has components (not shown) such as a color filter, a black matrix (BM), the above opposed electrode, and a wiring film. The opposed electrode is arranged on the side of the substrate 40 in some cases. A liquid crystal layer (not shown) is sandwiched between the substrate 40 and the opposed substrate. That is, liquid crystal is provided between the substrate 40 and the opposed substrate. Components (not shown) such as a polarization plate, and a wave plate are provided on an outer side surface of each of the substrate 40 and the opposed substrate. Thus, a liquid crystal panel includes the substrate 40, the opposed substrate, and the liquid crystal layer.

The liquid crystal sandwiched between the pixel electrode and the opposed electrode is driven by the electric field corresponding to the display voltage generated between them, and its orientation direction changes. Thus, a polarization state of light headed from the substrate 40 toward the opposed substrate through the liquid crystal layer changes based on the orientation direction of the liquid crystal of the liquid crystal layer. For example, light headed from the backlight unit toward the liquid crystal display panel becomes linearly polarized light by the polarization plate on the side of the substrate 40, and its polarization state changes after passing through the liquid crystal layer. Thus, the light which has passed through liquid crystal layer and been changed in polarization state moves to the polarization plate on the side of the opposed substrate.

Here, a light amount of the light which has reached the polarization plate and passed through the polarization plate on the side of the opposed substrate changes depending on the polarization state of the light. That is, the light amount of the light which has been emitted from the backlight unit and passed through the liquid crystal display panel changes depending on the orientation direction of the liquid crystal of the liquid crystal layer. As described above, since the orientation direction of the liquid crystal changes depending on the display voltage, the light amount of the light passing through the polarization plate on the view side can be changed by controlling the display voltage. Thus, by changing the display voltage with respect to each pixel 47 corresponding to an image dot, a desired image can be displayed on the liquid crystal display panel on the view side.

Thus, the description has been made of the configuration and the operation of the display device provided with the semiconductor device according to the present invention. Next, a description will be made of a preferred embodiment of the semiconductor device and a method for producing the semiconductor device according to the present invention.

<First Preferred Embodiment>

In a first preferred embodiment, a description will be made of an active matrix type TFT substrate having the above-described TFT 50 in a liquid crystal display device.

Figure 3:
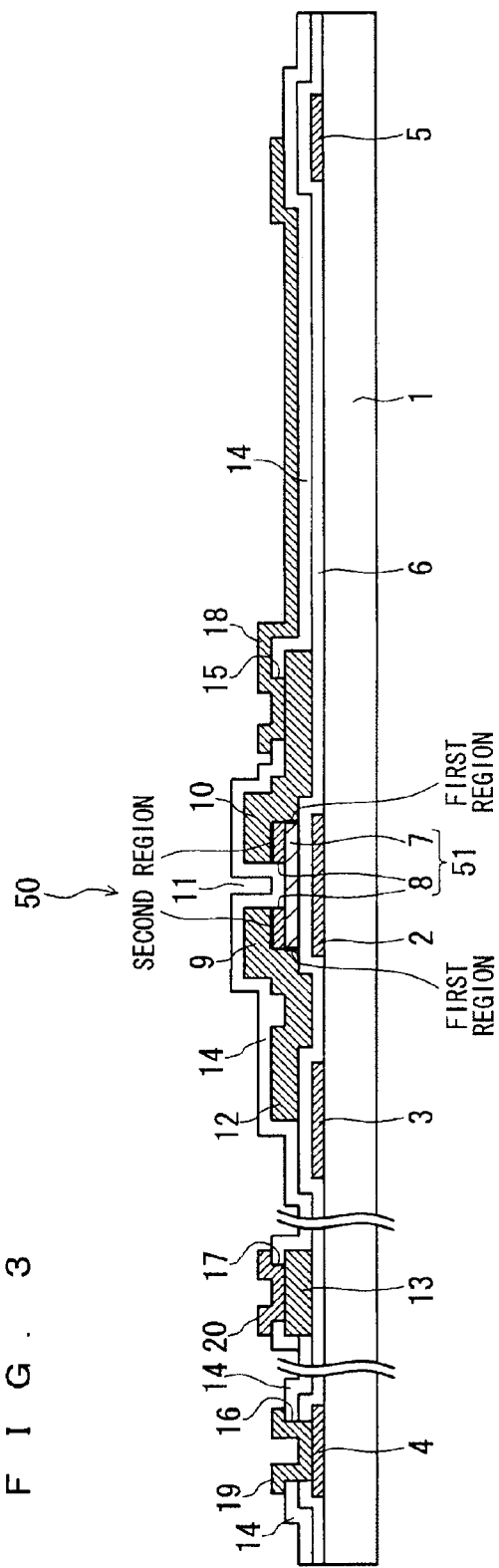
FIG. 3 is a cross-sectional view showing the TFT array substrate according to the first preferred embodiment.

FIG. 2 is a plan view showing an example of a planar structure of the TFT substrate, and FIG. 3 is a vertical cross-sectional view showing a cross-sectional structure of the TFT substrate. In addition, in FIG. 3, an A-A cross section, a B-B cross section, and a C-C cross section shown in FIG. 2 are shown side by side to facilitate the description of the TFT substrate. More specifically, the A-A section showing the TFT 50 and the pixel part is shown on the right side, the B-B cross section showing a gate terminal 4 is shown on the left side, and the C-C cross section showing a source terminal 13 is shown between them. In addition, in vertical cross-sectional views in the following description, the A-A to C-C cross sections are similarly shown.

The TFT 50 according to this preferred embodiment shown in FIGS. 2 and 3 includes a transparent insulation substrate 1, a gate electrode 2, a gate insulation film 6, a semiconductor layer 51, a source electrode 9, a drain electrode 10, and an interlayer insulation film 14.

The transparent insulation substrate 1 is made of glass or plastic. On the transparent insulation substrate 1, at least the gate electrode 2 including a metal film containing Al as a main component, a gate line 3 (corresponding to the above gate line 43) connected to the gate electrode 2, the gate terminal 4 connected to the gate line 3 and used to input the scan signal of the image, and an auxiliary capacitance electrode 5 connected to the drain electrode 10 are formed. In addition, the gate insulation film 6 is provides as an upper layer of the components 2, 3, 4, and 5.

The semiconductor layer 51 is provided so as to include a Si semiconductor active film 7 (first amorphous silicon film) and an ohmic low resistance Si film 8 (second amorphous silicon film) having an n-type conductivity with an impurity injected, being formed in this order on the gate electrode 2 with the gate insulation film 6 interposed between the gate electrode 2 and the semiconductor layer 51. The Si semiconductor active film 7 is a component of the TFT 50. In addition, the semiconductor layer 51 is formed on an inner side of an outer periphery of the gate electrode 2 in a planar view.

The source electrode 9 and the drain electrode 10 includes an Al alloy film (AlNiN film in this preferred embodiment) containing at least aluminum (Al), and directly connected to the semiconductor layer 51. An isolation region 11 is formed between the source electrode 9 and the drain electrode 10 to isolate them. In this preferred embodiment, the isolation region 11 is also formed in the ohmic low resistance Si film 8. According to the TFT 50 in this preferred embodiment, when a voltage is applied to the gate electrode 2, a channel part is formed in the vicinity of the isolation region 11 in the Si semiconductor active film 7, and current flows between the source electrode 9 and the drain electrode 10 through the channel part.

A source line 12 (corresponding to the above source line 44) is connected to the source electrode 9 of the TFT 50. In addition, in FIG. 3, a boundary between the source electrode 9 and the source line 12 is not shown. The source terminal 13 is connected to the source line 12 and used to receive an external video signal and input the video signal to the source electrode 9 through the source line 12.

The interlayer insulation film 14 is arranged so as to cover the above components. According to this preferred embodiment, the interlayer insulation film 14 is arranged on the gate insulation film 6, the Si semiconductor active film 7 under the isolation region 11, the source electrode 9, the drain electrode 10, the source line 12, and the source terminal 13. As shown in FIG. 3, a plurality of openings (three openings in FIG. 3) are formed in the interlayer insulation film 14. As these openings, a pixel drain contact hole 15, a gate terminal contact hole 16, and a source terminal contact hole 17 are formed. The pixel drain contact hole 15, the gate terminal contact hole 16, and the source terminal contact hole 17 reach the drain electrode 10, the gate terminal 4, and the source terminal 13 provided as lower layers, respectively.

A transmission pixel electrode 18 is a transparent conductive film connected to the drain electrode 10 through the pixel drain contact hole 15. A gate terminal pad 19 is connected to the gate terminal 4 through the gate terminal contact hole 16. A source terminal pad 20 is connected to the source terminal 13 through the source terminal contact hole 17.

The TFT substrate configured as described above, and the opposed substrate having the color filter for color display and the opposed electrode are bonded with a certain gap (cell gap) interposed therebetween, and the liquid crystal is injected and sealed, whereby the display device is produced.

According to the TFT 50 in this preferred embodiment, as will be described below, at least nitrogen (N) is contained in a first region that is in the vicinity of an interface between a side surface of the Si semiconductor active film 7 and the source and drain electrodes 9 and 10 by performing a nitridation treatment and the like on the side surface of the Si semiconductor active film 7. Thus, as will be described below, at least nickel (Ni), oxygen (O), and nitrogen (N) are contained in a second region that is in the vicinity of an interface between the ohmic low resistance Si film 8 and the source and drain electrodes 9 and 10 by performing an oxidation treatment and the like on the ohmic low resistance Si film 8.

Here, "in the vicinity of the interface" and "in the vicinity of the connection interface" means a region on the side of the interface from at least a half of a film thickness, depending on a condition such as a film thickness adjacent to the interface. In addition, the second region only has to be provided in the vicinity of the interface between an upper surface of the ohmic low resistance Si film 8 and the source and drain electrodes 9 and 10, and it may be provided or may not be provided in the vicinity of the interface between a side surface of the ohmic low resistance Si film 8 and the source and drain electrodes 9 and 10. In addition, the Si-based film (Si film, or a film containing Si more than another atom, and the Si semiconductor active film 7 in this case), and the Al alloy film (source and drain electrodes 9 and 10) may be connected in such a manner that the Si-based film and the Al alloy film are partially connected with each other.

According to the TFT 50 in this preferred embodiment, the Si-based film (Si semiconductor active film 7) and the Al alloy film (source and drain electrodes 9 and 10) are directly connected without a high melting point metal burrier layer. Despite that, the TFT 50 shows on characteristics and off characteristics similar to the TFT having the high melting point metal burrier layer even after being subjected to a high temperature.

It is supposed that this effect is provided because a mutual diffusion reaction is prevented between a Si atom of the Si semiconductor active film 7 and an Al atom of the source and drain electrodes 9 and 10 due to the nitrogen containing layer provided in the vicinity of the interface (first region) between the Si semiconductor active film 7 and the source and drain electrodes 9 and 10. Thus, it is supposed that a mutual diffusion reaction is prevented between a Si atom of the ohmic low resistance Si film 8 and a Ni atom of the source and drain electrodes 9 and 10 due to the oxygen containing layer provided in the vicinity of the interface (second region) between the ohmic low resistance Si film 8 and the source and drain electrodes 9 and 10. Furthermore, according to this preferred embodiment, since the source and drain electrodes 9 and 10 include the AlNiN film, and the nitrogen containing layer is also provided in the second region, it is supposed that a mutual diffusion reaction is prevented between the Si atom of the ohmic low resistance Si film 8 and the Al atom of the source and drain electrodes 9 and 10.

As will be described below, even when a heat treatment temperature for the TFT substrate provided with the TFT 50 according to this preferred embodiment is actually increased to 300° C., the diffusion reaction is not generated between the AlNiN film and the Si film, and the TFT characteristics do not deteriorate, so that the on characteristics and the off characteristics can be the same or more than that of the TFT having the high melting point metal burrier layer.

<Method for Producing TFT Substrate According to First Preferred Embodiment>

A description will be made of steps of a method for producing the TFT substrate provided with the TFT 50 having the above effect according to the first preferred embodiment, with reference to FIGS. 4 to 7 showing the cross sections of the TFT substrate in respective steps.

Figure 4:
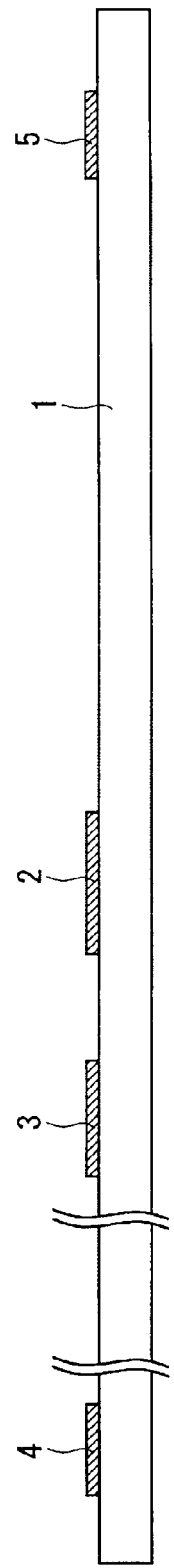
FIGS. 4 to 7 are cross-sectional views showing method for producing the TFT array substrate according to the first preferred embodiment.

Referring to FIG. 4, the transparent insulation substrate 1 such as a glass substrate is cleaned with a cleaning liquid or pure water, and a metal film to become the component such as the gate electrode 2 is formed on the transparent insulation substrate 1. The metal film is preferably formed of a metal or an alloy having low electric specific resistance, and an AlNi alloy is used here.

As a preferable production method example, here, an AlNi alloy film containing 2 mol % (at %) of Ni is formed to be 200 nm in thickness by a sputtering method using an argon (Ar) gas or a krypton (Kr) gas. As for a sputtering condition, a DC (Direct Current) magnetron sputtering method is used such that an AlNi alloy containing 2 mol % of Ni in Al is used as a target, a power density is set at 3 W/cm$^2$, and an Ar gas flow rate is set at $2.4 \times 10^{-3}$ m$^3$/h (40 sccm) when the film is formed. A Ni composition in the AlNi alloy film actually formed by the above treatment is almost the same as the composition of the target, that is, about 2 mol % of Ni. In addition, a specific resistance value of the AlNi alloy film is about 12 μΩ·cm just after the film is formed, but it is reduced to about 5 μΩ·cm which is lower than that of the general high melting point metal material after a heat treatment at 300° C. performed as a post-step. Thus, the specific resistance value of the AlNi alloy film to become the component such as the gate line 3 can be lowered through the heat treatment.

Then, the metal film is patterned by a first photolithography process, whereby the gate electrode 2, the gate line 3, the gate terminal 4, and the auxiliary electrode 5 are formed (FIG. 4). In this preferred embodiment, a photoresist pattern is formed by the photolithography process and then, the AlNi alloy film is etched using the well-known chemical solution including phosphoric acid, nitric acid, and acetic acid, whereby the components such as the gate electrode 2 are formed. After that, the photoresist pattern is removed.

Figure 5:
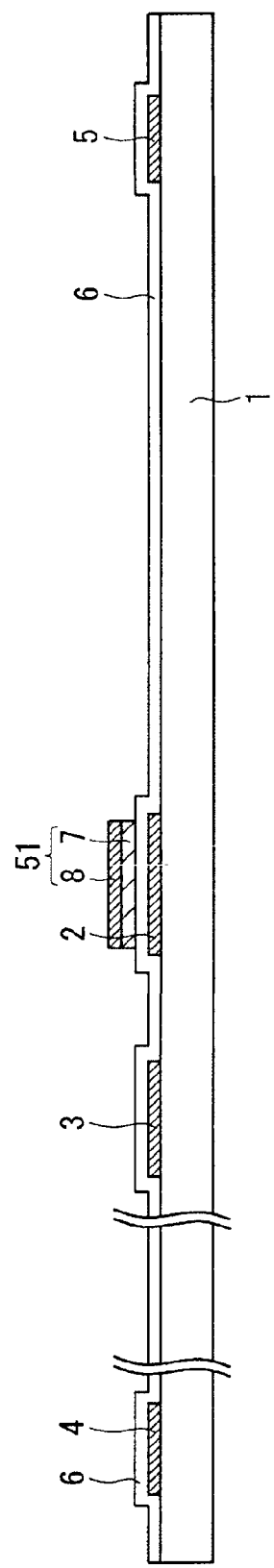

Then, referring to FIG. 5, the gate insulation film 6 including silicon nitride (SiN), an amorphous silicon (a-Si) film to become the Si semiconductor active film 7, and an n-type amorphous silicon (n+a-Si) film added with an impurity to become the ohmic low resistance Si film 8 are sequentially formed on the structure provided by the above steps.

As a preferable production method example, a chemical vapor deposition (CVD) method is used here, and the films are sequentially formed such that the SiN film is formed to be 400 nm in thickness, the a-Si film is formed to be 150 nm in thickness, and the n+a-Si film added with phosphor (P) as the impurity is formed to be 50 nm in thickness under a substrate heating condition of 300° C.

Then, the a-Si film and the n+a-Si film are patterned by a second photolithography process, whereby the semiconductor layer 51 (Si semiconductor active film 7 and the ohmic low resistance Si film 8) are formed. Thus, the structure shown in FIG. 5 is provided. According to this preferred embodiment, a photoresist pattern is formed by the photolithography process and then the a-Si film and the n+a-Si film are etched away by the well-known dry etching method using a fluorine series gas, whereby the semiconductor layer 51 (Si semiconductor active film 7 and the ohmic low resistance Si film 8) is formed as the component of the TFT 50.

Then, the side surface of the Si semiconductor active film 7 and the side surface of the ohmic low resistance Si film 8 are subjected to the nitridation treatment with the photoresist pattern remained on the ohmic low resistance Si film 8.

As a preferable production method example, the treatment is performed for 5 minutes in a parallel plate type plasma generation device under the condition that a substrate temperature is set at room temperature, a pressure is set at 50 Pa, a frequency is set at 13.56 MHz, a power density is set at 0.5 W/cm$^2$, and a N$_2$ gas flow rate is set at 100 sccm. An element distribution state of the side surface of the Si semiconductor active film 7 actually formed by the above treatment is analyzed by an energy dispersive X-ray spectroscopy (TEM-EDX), and it is found that an area density of Si—N binding (binding of a Si atom and a N atom) is 46.2%. This area density corresponds to an abundance ratio of the Si—N binding calculated from peak intensity of silicon (Si), nitrogen (N), and oxygen (O) in the region of the side surface of the Si semiconductor active film 7 analyzed by the TEM-EDX. That is, the fact that the area density of the Si—N binding is 46.2% as analyzed above means a nitrogen containing state in which Si—O binding (binding of the Si atom and an O atom) and Si—Si binding (binding of the Si atom and the Si atom) exist in a remaining area density of 53.8%.

In addition, other than this analysis, the side surface of the above Si semiconductor active film 7 is measured by a SIMS (Secondary Ion Mass Spectrometer), and it is confirmed that a nitrogen containing layer of the Si semiconductor active film 7 is formed to be 5 nm in thickness from the side surface of the Si semiconductor active film 7.

While the nitrogen containing layer is formed by the N$_2$ plasma treatment in the preferable production method example, a desired nitrogen containing layer can be also obtained by a heating treatment in an atmosphere containing the N atom, or N atom ion injection instead of the above method, which has been confirmed by experiments. Thus, since each of the treatments as described above can nitrogenize the side surface of the Si semiconductor active film 7 and the side surface of the ohmic low resistance Si film 8, the nitridation treatment can be performed by combining the above treatments as well as by each treatment.

Then, the photoresist pattern on the ohmic low resistance Si film 8 is removed (FIG. 5), and then the Si semiconductor active film 7 and the ohmic low resistance Si film 8 are oxidized.

As a preferable production method example, here, the Si semiconductor active film 7 and the ohmic low resistance Si film 8 are exposed in an ozone atmosphere for 3 minutes at the same time by an ozone oxidation treatment. The surface of the ohmic low resistance Si film 8 after actually subjected to this treatment is analyzed by XPS (X-ray photoelectron spectrometer), and it is found that an area density of Si—O binding is 27.8%, and an area density of Si—N binding is 0%. The area density correspond to an abundance ratio of the Si—O binding, Si—N binding, and Si—Si binding in the surface of the ohmic low resistance Si film 8 analyzed by the XPS method. That is, the fact that the area density of the Si—O binding is 27.8% and the area density of the Si—N binding is 0% as analyzed above shows an oxygen containing state in which the Si—Si binding exists in a remaining area density of 72.2%.

Other than this analysis, the surface of the ohmic low resistance Si film 8 is measured by a spectroscopic ellipsometer, and it is confirmed that the oxygen containing layer of the ohmic low resistance Si film 8 is formed to be 10 nm in thickness from the surface of the ohmic low resistance Si film 8.

While the oxygen containing layer is formed by the ozone oxidation method in the above preferable production method example, the present invention is not limited to this method, and a desired oxygen containing layer can be also obtained by a heating treatment in an atmosphere containing an O atom, a plasma treatment using a gas containing the O atom, or ion implantation of the O atom, which has been confirmed by experiments. Thus, since each of the treatments as described above can oxidize the ohmic low resistance Si film 8, the oxidation treatment can be performed by combining the above treatments as well as by each treatment.

Figure 6:
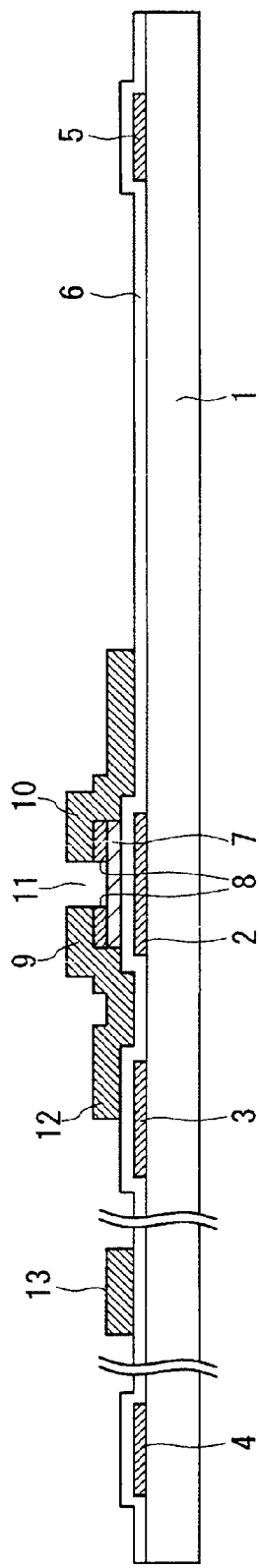

Then, referring to FIG. 6, an Al alloy film to become the source and drain electrodes 9 and 10 is formed on the structure obtained by the above steps. The Al alloy film preferably satisfies that (1) its electric specific resistance is low, (2) preferable contact characteristics with the ohmic low resistance Si film 8 are shown, and (3) preferable contact characteristics with a conductive film to become the transmission pixel electrode 18 in a post-step are shown (especially, electric contact resistance is low), so that a film such as an AlNi alloy film is preferably used.

As a preferable production method example, here, an AlNiN film is formed by a DC magnetron sputtering method using an AlNi alloy in which 2 mol % of Ni is added to Al as a target. The sputtering is performed using a mixture gas provided by adding a $N_2$ gas to an Ar gas such that an Ar gas flow rate is set at $2.4 \times 10^{-3}$ m$^3$/h (40 sccm), and a $N_2$ gas flow rate is set at $3 \times 10^{-4}$ m$^3$/h (5 sccm). Thus, a power density is set at 3 W/cm$^2$ when the film is formed. Under this condition, the AlNiN film having a film thickness of about 200 nm is formed as the Al alloy film to become the source and drain electrodes 9 and 10.

In addition, a composition of the actually formed AlNiN film as the Al alloy film is examined, and it is found that the Al alloy film contains 2 mol % of Ni and 5 mol % of N. Thus, a specific resistance value of the Al alloy film is about 15 μΩ·cm just after the film is formed, but it is reduced to about 10 μΩ·cm which is lower than that of the general high melting point metal material after a heat treatment at 300° C. performed in a post-step. Thus, the specific resistance value of the source and drain electrodes 9 and 10 including the Al alloy film can be lowered through the heat treatment.

While the mixture gas in which the $N_2$ gas is added to the Ar gas is used in the sputtering in the preferable production method example, the present invention is not limited to this, and instead of the above mixture, N can be added to the Al alloy using a mixture gas in which the $N_2$ gas is added to a krypton (Kr) gas. In the case where the mixture gas of the Kr gas is used, a defect and stress of the film can be reduced compared with the case where the mixture gas of the Ar gas is used, so that even when the heat treatment is not performed, the specific resistance can be reduced to about 10 μΩ·cm as low as the case where the heat treatment is performed. In addition, while the $N_2$ gas is added to the sputtering gas such as the Ar gas or Kr gas in the preferable production method example, the present invention is not limited to this, and instead of the $N_2$ gas, N can be added to the Al alloy by adding a gas containing N such as $NH_3$. In addition, N can be added to the Al alloy to become the source and drain electrodes 9 and 10 using a sputtering target including an Al alloy containing N such as AlNiN. In this case, the mixture gas added with the $N_2$ gas or the gas containing N is not necessarily used as the sputtering gas, N can be added to the Al alloy when only the Ar gas or only the Kr gas is used as the sputtering gas.

Then, the Al alloy film formed by the above sputtering is patterned by a third photolithography process, whereby the source electrode 9, the drain electrode 10, the source line 12, and the source terminal 13 are formed. Then, the ohmic low resistance Si film 8 is partially removed to form the isolation region 11 (FIG. 6). According to this preferred embodiment, a photoresist pattern is formed by the photolithography process and then, the AlNiN film is etched using the well-known chemical solution including phosphoric acid, nitric acid, and acetic acid, whereby the source and drain electrodes 9 and 10 are formed. After that, an exposed part of the ohmic low resistance Si film 8 provided between the source electrode 9 and the drain electrode 10 is etched by the well-known dry etching containing the fluorine series gas, whereby the isolation region 11 is formed. After that, the photoresist pattern is removed. Thus, the step shown in FIG. 6 is completed.

Thus, according to the steps shown in FIGS. 5 and 6, the side surface of the Si semiconductor active film 7 is nitrogenized in the step shown in FIG. 5, and the source and drain electrodes 9 and 10 which are in contact with the side surface of the Si semiconductor active film 7 are formed in the step shown in FIG. 6, so that nitrogen (N) is contained in the vicinity of the connection interface (first region) between the side surface of the Si semiconductor active film 7 and each of the source and drain electrodes 9 and 10. In addition, the ohmic low resistance Si film 8 is oxidized in the step shown in FIG. 5, and the source and drain electrodes 9 and 10 including the AlNiN film which is in contact with the ohmic low resistance Si film 8 are formed in the step shown in FIG. 6, so that nickel (Ni), oxygen (O), and nitrogen (N) are contained in the vicinity of the connection interface (second region) between the ohmic low resistance Si film 8 and each of the source and drain electrodes 9 and 10. Here, in this preferred embodiment, it is assumed that a content rate of nitrogen (N) in the first region is higher than a content rate of nitrogen (N) in the second region.

Thus, while the source and drain electrodes 9 and 10 include the AlNiN film, and nickel (Ni) and nitrogen (N) are contained in the second region by the above-described production method, the present invention is not limited to this. For example, in a case where the source and drain electrodes 9 and 10 are formed of an AlNi alloy film not containing N, after the photoresist pattern is removed in the step shown in FIG. 5, around the time of oxidation of the Si semiconductor active film 7 and the ohmic low resistance Si film 8, nitridation treatment to nitride the Si semiconductor active film 7 and the ohmic low resistance Si film 8 may be additionally performed. In this case also, in the second region, nickel (Ni) is contained from the source and drain electrodes 9 and 10, and oxygen (O) and nitrogen (N) are contained by the oxidation treatment and nitridation treatment. In addition, as for evaluation of the TFT 50 as will be described below, the evaluation is performed for the TFT in which the nitridation treatment is additionally performed around the time of the oxidation treatment.

Figure 7:
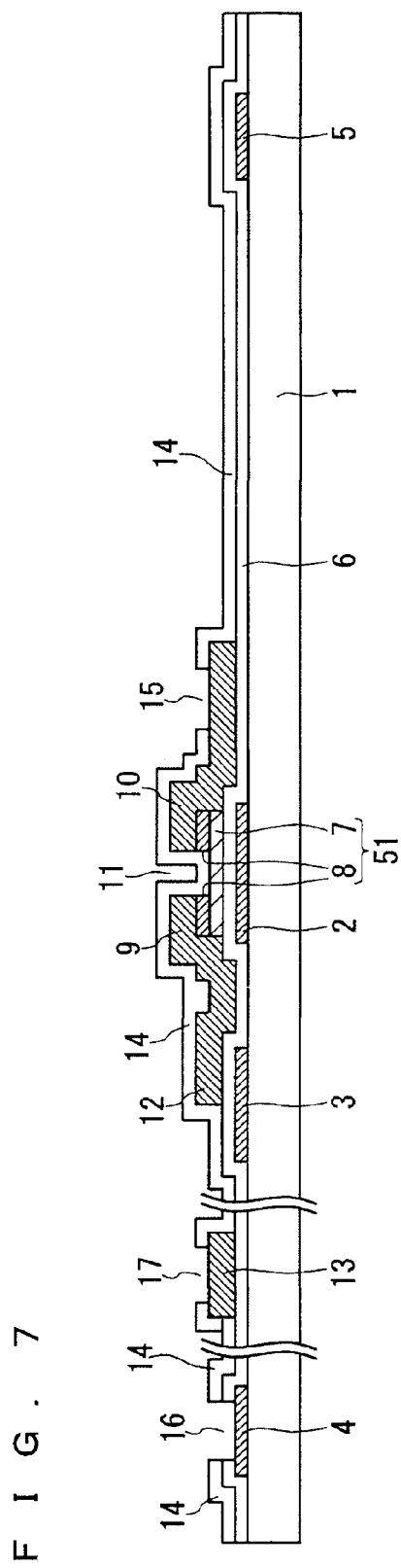

Then, referring to FIG. 7, the interlayer insulation film 14 is formed as a passivation film on the structure obtained by the above steps. As a preferable production method example, here, a CVD method is used, and a SiN film is formed to be 300 nm in thickness as the interlayer insulation film 14 under a substrate heating condition of about 250° C.

Then, the interlayer insulation film 14 is patterned by a fourth photolithography process, whereby at least the pixel drain contact hole 15 reaching the surface of the drain electrode 10, the gate terminal contact hole 16 reaching the surface of the gate terminal 4, and the source terminal contact hole 17 reaching the surface of the source terminal 13 are formed almost the same time (FIG. 7). In this preferred embodiment, a photoresist pattern is formed by the photolithography process, and the interlayer insulation film 14 is etched by the well-known dry etching method using the fluorine series gas, whereby the holes such as the pixel drain contact hole 15 are formed. After that, the photoresist pattern is removed.

Finally, referring to FIG. 3, a transparent conductive film is formed on the structure obtained by the above steps so as to be connected to the drain electrode 10, the gate terminal 4, and the source terminal 13 through the pixel drain contact hole 15, the gate terminal contact hole 16, and the source terminal contact hole 17, respectively.

As a preferable production method example, here, an ITO film including an indium oxide ($In_2O_3$) and an tin oxide ($SnO_2$) is formed to be 100 nm in thickness as the transparent conductive film by the well-known sputtering method using an Ar gas.

Then, the transparent conductive film is patterned by a fifth photolithography process, whereby the transmission pixel electrode 18, the gate terminal pad 19, and the source terminal pad 20 are formed so as to be electrically connected to the drain electrode 10, the gate terminal 4, and the source terminal 13, respectively (FIG. 3). In this preferred embodiment, after the transparent conductive film (ITO film) has been formed, a photoresist pattern is formed by the photolithography process, the ITO film is etched and patterned with the well-known solution containing hydrochloric acid and nitric acid, and then the photoresist pattern is removed, whereby the electrodes such as the transmission pixel electrode 18 are formed.

The TFT substrate completed as described above is subjected to a heat treatment at a temperature about 200° C. to 300° C. Through the heat treatment, static charge and stress accumulated in the whole TFT substrate can be removed or relieved, and electric specific resistance of the metal film can be lowered, whereby the TFT characteristics can be improved and stabilized. As a preferable production method example, here, the TFT substrate is subjected to the heat treatment such that the TFT substrate is held in the air at about 300° C. for 30 minutes.

<Evaluation of TFT>

Then, evaluation is made on the barrier layer having a high N concentration in the TFT 50 produced by the above production method. More specifically, evaluation is made on proper amounts of an O atomic weight and an N atomic weight in the vicinity of the interface (second region) between the ohmic low resistance Si film 8 and the source and drain electrodes 9 and 10, and a proper amount of an N atomic weight in the vicinity of the interface (first region) between the Si semiconductor active film 7 and the source and drain electrodes 9 and 10.

In addition, the TFT 50 not having the high melting point metal burrier layer and serving as an evaluation target (hereinafter, referred to as the "evaluation target TFT" occasionally) is formed such that after the side surface of the Si semiconductor active film 7 has been nitrogenized and then the ohmic low resistance Si film 8 has been nitrogenized and oxidized, the AlNi alloy film (source and drain electrodes 9 and 10) not containing nitrogen is formed. Then, the TFT substrate is subjected to the heat treatment in the air at 300° C. for 30 minutes, and the on characteristics and off characteristics are examined.

In addition, evaluation is separately made on electric characteristics affected by the interface between the ohmic low resistance Si film 8 and the Al alloy film, and electric characteristics affected by the interface between the Si semiconductor active film 7 and the Al alloy film. More specifically, with respect to the former, the evaluation is made on the electric characteristics of a structure in which light from the backlight is not shielded by the gate electrode 2, that is, a structure in which the gate electrode 2 is not provided just under the interface between the Si semiconductor active film 7 and the source and drain electrodes 9 and 10. Then, with respect to the latter, the evaluation is made on the electric characteristics of a structure in which the light from the backlight is shielded by the gate electrode 2, that is, a structure in which the gate electrode 2 is provided just under the interface between the Si semiconductor active film 7 and the source and drain electrodes 9 and 10.

Figure 8:
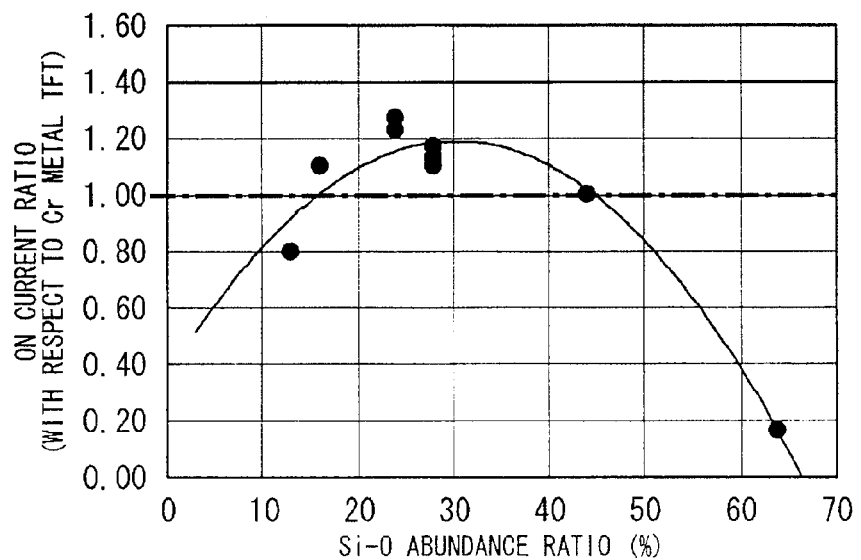
FIGS. 8 to 11 are views showing evaluation of the TFT according to the first preferred embodiment.

FIG. 8 shows a change in on characteristics with respect to the abundance ratio of the Si—O binding (O atom) of the ohmic low resistance Si film 8 (the area density of the Si—O bonding in the second region) in the evaluation target TFT in which light is not shielded. In addition, the source and drain electrodes 9 and 10 of the evaluation target TFT each include the AlNi film (Ni composition is 2 mol %) not containing nitrogen.

In FIG. 8, the on characteristics are shown by a value (on current ratio) provided by dividing an on current value of the evaluation target TFT by an on current value of a TFT having a Cr metal as a high melting point metal burrier layer (hereinafter, referred to as the "Cr metal TFT"). That is, in FIG. 8, when the on current ratio is 1 or more, it means that the on characteristics of the evaluation target TFT is superior to that of the Cr metal TFT.

In FIG. 8, as the abundance ratio of the Si—O binding increases to about 30%, the on current ratio increases. This is because the Si—O binding prevents a compound reaction and a mutual diffusion reaction between the Al atom and the Ni atom of the source and drain electrodes 9 and 10, and the Si atom of the ohmic low resistance Si film 8. However, after the abundance ratio of the Si—O binding exceeds 30%, the Al atom and the O atom are bound and an aluminum oxide layer having high resistance is formed, so that the on current ratio decreases. Since there is such relationship between the Si—O binding and the on characteristics, the area density of the Si—O binding is preferably within a range of 15% to 45%, more preferably 30%, in the second region, in order to obtain the on current value which is the same or more than that of the standard Cr metal TFT (on current ratio is 1 or more).

Figure 9:
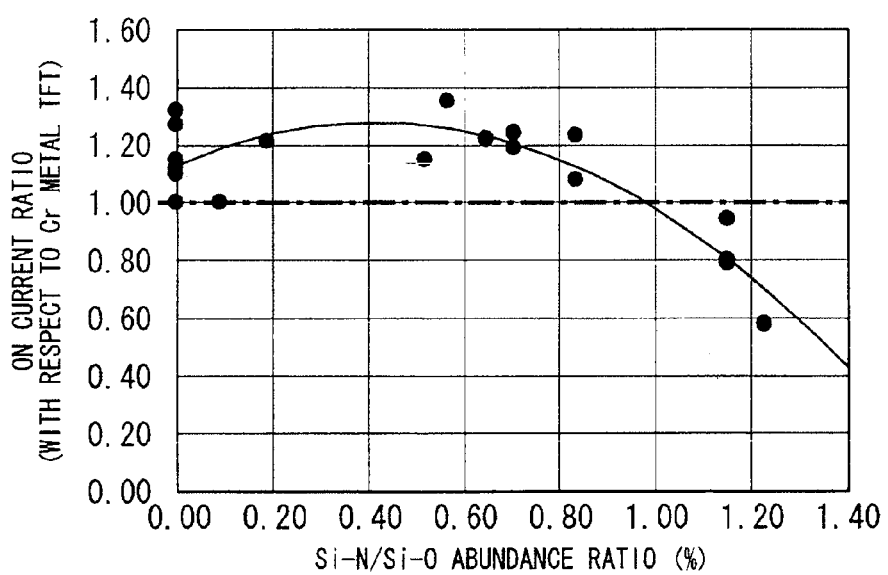

FIG. 9 shows a relationship of the on current ratio with respect to a ratio of (Si—N binding)/(Si—O binding) in the case where the N atom (Si—N binding) is contained under the condition that the abundance ratio of the Si—O binding is 15% to 45%, in the vicinity of the interface (second region) between the ohmic low resistance Si film 8 and the source and drain electrodes 9 and 10 in the evaluation target TFT. Here, the ratio of (Si—N binding)/(Si—O binding) means a ratio of (area density of the Si—N binding)/(area density of the Si—O binding). As shown in FIG. 9, when the ratio of (Si—N binding)/(Si—O binding) exceeds 1, the on current ratio become 1 or less, so that the on current value of the evaluation target TFT becomes lower than that of the standard Cr metal TFT. Therefore, the ratio of (Si—N binding)/(Si—O binding) is preferably 1 or less, more preferably 0.4 to 0.5 in the second region.

Figure 10:
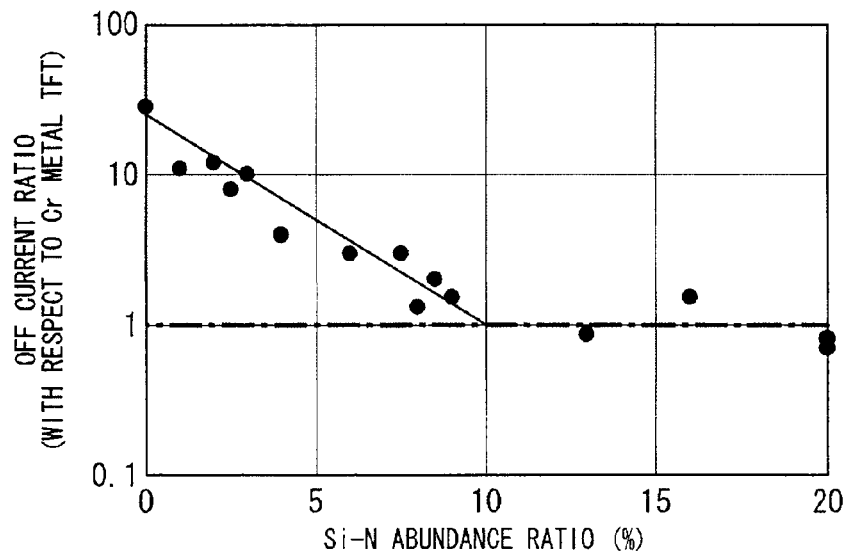

FIG. 10 shows a change in off characteristics with respect to the abundance ratio of the Si—N binding of the ohmic low resistance Si film 8 (area density of the Si—N binding in the second region), in the evaluation target TFT in which light is not shielded. In FIG. 10, the off characteristics are shown by a value (off current ratio) provided by dividing an off current value of the evaluation target TFT by an off current value of the Cr metal TFT. That is, in FIG. 10, when the off current ratio is 1 or more, it means that the off characteristics of the evaluation target TFT is superior to that of the Cr metal TFT.

In FIG. 10, when the abundance ratio of the Si—N binding is 10% or less, a mutual diffusion reaction proceeds between the Al atom of the source and drain electrodes 9 and 10 and the Si atom of the ohmic low resistance Si film 8, so that the off current ratio is high. Therefore, the area density of the Si—N binding is preferably about 10% or more in the second region.

Figure 11:
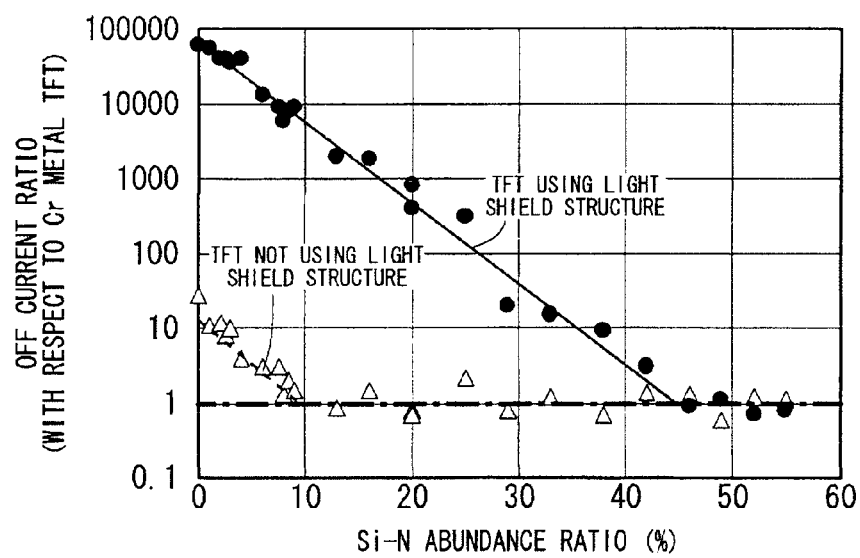

FIG. 11 shows a change in off characteristics with respect to the abundance ratio of the Si—N binding on the side surface of the Si semiconductor active film 7 (area density of the Si—N binding in the first region), in the evaluation target TFT in which light is shielded. As shown in FIG. 11, the area density of the Si—N binding is preferably 45% or more in the first region.

According to the TFT 50 in this preferred embodiment, nitrogen (N) is contained in the vicinity of the interface (first region) between the side surface of the Si semiconductor active film 7 and the source and drain electrodes 9 and 10. In this configuration, even when the high melting point metal burrier layer is not provided, the preferable off characteristics (off current ratio) after the high-temperature heat treatment are shown. Especially, when the area density of the Si—N binding is 45% or more in the first region, the off characteristics in the TFT 50 not having the high melting metal burrier layer according to this preferred embodiment can be the same as those of the TFT having the high melting point metal burrier layer.

In addition, according to the TFT 50 in this preferred embodiment, nickel (Ni), oxygen (O), and nitrogen (N) are contained in the vicinity of the interface (second region) between the ohmic low resistance Si film 8 and the source and drain electrodes 9 and 10. In this configuration, even when the high melting metal burrier layer is not provided, the preferable on characteristics (on current ratio) after the high-temperature heat treatment can be obtained. Especially, when the area density of the Si—O binding is within a range of 15 to 45%, and the ratio of (Si—N binding)/(Si—O binding) is 1 or less in the second region, the on characteristics can be superior to that of the semiconductor device having the high melting metal burrier layer. In addition, when the area density of the Si—N binding is 10% or less in the second region, the off characteristics in the TFT 50 having no high melting metal burrier layer according to this preferred embodiment can be the same as those of the TFT having the high melting metal burrier layer.

In addition, FIG. 11 also shows a change in off characteristics in the TFT structure in which light is not shielded, for comparison. As shown in the drawing, in order to improve the off characteristics in the TFT structure in which light is shielded, it is necessary to contain more Si—N than that of the TFT structure in which light is shielded. The inventor has considered this fact as follows.

The Si semiconductor active film 7 is crystallized due to the mutual diffusion reaction in Schottky junction interface between the side surface of the Si semiconductor active film 7 and the source and drain electrodes 9 and 10, that is, in the first region. A bandgap becomes narrow due to this crystallization, so that a withstand voltage (absolute value of a breakdown voltage) to reverse bias becomes low in the first region. In addition, in the TFT structure in which light is shielded, the Schottky junction interface (first region) exists in the vicinity of the gate electrode 2, so that the reverse bias strongly contributes thereto, and the hole is likely to be induced. As a result, it is supposed that the withstand voltage of the first region to the reverse bias is low. Thus, it is supposed that in the TFT structure in which light is shielded, more Si—N has to be contained in the first region than that of the TFT structure in which light is not shielded in order to improve the off characteristics. Meanwhile, since the upper surface of the Si semiconductor active film 7 is connected to the source and drain electrodes 9 and 10 through the ohmic low resistance Si film 8, it is supposed that a withstand voltage to the reverse bias is higher than that of the first region.

<Second Preferred Embodiment>

A description will be made of a second preferred embodiment assuming that the semiconductor device according to the present invention is the TFT 50 similar to the first preferred embodiment described above. According to the TFT substrate in this preferred embodiment, the number of times of nitridation treatments with the $N_2$ plasma and the like can be reduced, and a load of steps can be reduced compared with the first preferred embodiment. Hereinafter, while the TFT substrate according to this preferred embodiment will be described, the same reference as that of the first preferred embodiment is allotted to the same component as that of the first preferred embodiment, and a part different from the first preferred embodiment will be mainly described.

Figure 12:
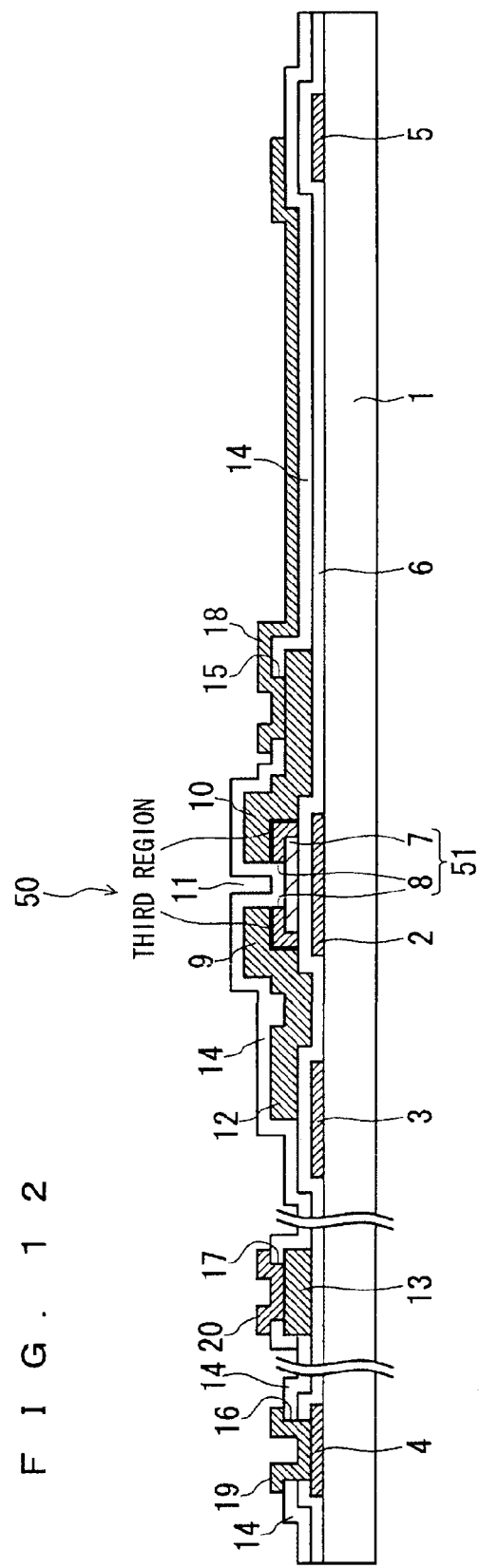
FIG. 12 is a cross-sectional view showing a TFT array substrate according to a second preferred embodiment.

A planar structure of the TFT substrate according to this preferred embodiment is the same as the planar structure of the TFT substrate shown in FIG. 2. FIG. 12 is a cross-sectional view showing a structure of the TFT substrate according to this preferred embodiment, in which the A-A cross section, the B-B cross section, and the C-C cross section in FIG. 2 are shown side by side, similar to FIG. 3.

The TFT 50 according to this preferred embodiment shown in FIGS. 2 and 12 includes the transparent substrate 1, the gate electrode 2, the gate insulation film 6, the semiconductor layer 51, the source electrode 9, the drain electrode 10, and the interlayer insulation film 14.

The semiconductor layer 51 according to this preferred embodiment includes the Si semiconductor active film 7 (first amorphous silicon film), and the ohmic low resistance Si film 8 (second amorphous silicon film) having n-type conductivity and covering the Si semiconductor active film 7 except for the isolation region 11 being formed on the gate electrode 2 with the gate insulation film 6 interposed between the gate electrode 2 and the semiconductor layer 51. In addition, the source and drain electrodes 9 and 10 according to this preferred embodiment includes the Al alloy film containing at least aluminum (Al), and directly connected only to the ohmic low resistance Si film 8 of the semiconductor layer 51.

Thus, according to the TFT 50 in this preferred embodiment, as will be described below, at least nickel (Ni), oxygen (O), and nitrogen (N) are contained in a region (hereinafter, referred to as the "third region") that is in the vicinity of the interface between the ohmic low resistance Si film 8 and the source and drain electrodes 9 and 10 by performing the nitridation treatment and the like on the ohmic low resistance Si film 8.

Here, "in the vicinity of the interface" and "in the vicinity of the connection interface" means a region on the side of the interface from at least a half of a film thickness, depending on a condition such as a film thickness adjacent to the interface. In addition, the third region only has to be provided in the vicinity of the interface between an upper surface of the ohmic low resistance Si film 8 and the source and drain electrodes 9 and 10, and it may be provided or may not be provided in the vicinity of the interface between a side surface of the ohmic low resistance Si film 8 and the source and drain electrodes 9 and 10.

According to the TFT 50 in this preferred embodiment, the film mainly including Si (ohmic low resistance Si film 8 here) and the Al alloy film (source and drain electrodes 9 and 10) are directly connected without the high melting point metal burrier layer. Despite that, the TFT 50 according to this preferred embodiment shows the same on characteristics and off characteristics as that of the TFT having the high melting point metal burrier layer even after being subjected to a high temperature.

It is supposed that this effect can be obtained because a mutual diffusion reaction is prevented between the Si atom of the ohmic low resistance Si film 8 and the Al atom of the source and drain electrodes 9 and 10 due to the nitrogen containing layer formed in the vicinity of the interface (third region) between the ohmic low resistance Si film 8 and the source and drain electrodes 9 and 10. Thus, it is supposed that a mutual diffusion reaction is prevented between the Si atom of the ohmic low resistance Si film 8 and the Ni atom of the source and drain electrodes 9 and 10 due to the oxygen containing layer provided in the vicinity of the interface (third region) between the ohmic low resistance Si film 8 and the source and drain electrodes 9 and 10.

As will be described below, even when a heat treatment temperature to the TFT substrate provided with the TFT 50 according to this preferred embodiment is actually increased to 300° C., the diffusion reaction is not generated between the AlNiN film and the Si film, and the TFT characteristics do not deteriorate, so that the on characteristics and the off characteristics can be the same or more than that of the TFT having the high melting point metal burrier layer.

<Method for Producing TFT Substrate According to Second Preferred Embodiment>

Next, a description will be made of steps of a method for producing the TFT substrate having the TFT 50 having the above effect according to a second preferred embodiment mainly with respect to a part different from the first preferred embodiment.

First, through the same steps as those of the production method (including the first photolithography process) according to the first preferred embodiment described with reference to FIG. 4, the gate electrode 2, the gate line 3, the gate terminal 4, and the auxiliary capacity electrode 5 are formed on the transparent insulation substrate 1.

Figure 13:
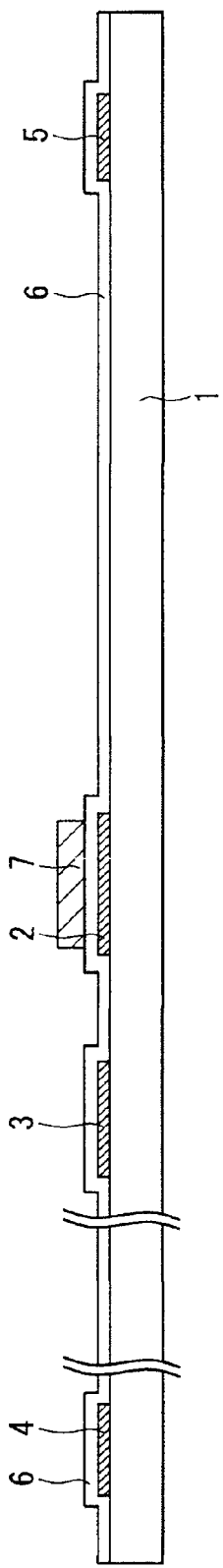
FIGS. 13 to 15 are cross-sectional views showing method for producing the TFT array substrate according to the second preferred embodiment.

Then, referring to FIG. 13, the gate insulation film 6 including the SiN film, and an a-Si film which will become the Si semiconductor active film 7 and the ohmic low resistance Si film 8 are sequentially formed.

As a preferable production method example, here, the CVD method is used and the SiN film having a thickness of 400 nm and the a-Si film having a thickness of 200 nm are sequentially formed under a substrate heating condition at about 300° C.

Then, the a-Si film is patterned by a second photolithography process. Then, the photoresist pattern is removed and phosphorus (P) is injected in the upper surface and the side surface of the patterned a-Si film as an impurity, whereby the ohmic low resistance Si film 8 is formed as a n+a-Si film, and the Si semiconductor active film 7 is formed as the remaining a-Si film covered with the ohmic low resistance Si film 8. In addition, the impurity injection in forming the ohmic low resistance Si film 8 is performed in an ion injection device and a thickness of the n+a-Si film is adjusted so as to be 50 nm.

According to the first preferred embodiment after the semiconductor layer 51 has been formed, the side surface of the semiconductor layer 51 (the side surface of the Si semiconductor active film 7 and the side surface of the ohmic low resistance Si film 8) is nitrogenized by the nitridation treatment. Meanwhile, according to this preferred embodiment, the ohmic low resistance Si film 8 is oxidized by the oxidization treatment instead of the nitridation treatment.

As a preferable production method example, here, the ohmic low resistance Si film 8 is exposed in an ozone atmosphere for 3 minutes by an ozone oxidation treatment. The surface of the ohmic low resistance Si film 8 actually subjected to this treatment is analyzed by the XPS (X-ray photoelectron spectrometer), and it is found that an area density of Si—O binding is 26.7%, and an area density of Si—N binding is 0%. The area density corresponds to an abundance ratio of Si—O binding, Si—N binding, and Si—Si binding in the surface of the ohmic low resistance Si film 8 analyzed by the XPS method. That is, the fact that the area density of the Si—O binding is 26.7% and the area density of the Si—N binding is 0% as analyzed above shows an oxygen containing state in which the Si—Si binding exists in a remaining area density of 73.3%.

Other than this analysis, the surface of the ohmic low resistance Si film 8 is measured by a spectroscopic ellipsometer, and it is confirmed that the oxygen containing layer of the ohmic low resistance Si film 8 is formed to be 10 nm in thickness from the surface of the ohmic low resistance Si film 8. In addition, while the oxygen containing layer is formed by the ozone oxidation method in the preferable production method example, the present invention is not limited to this, and the oxygen containing layer may be formed by any one of the various oxidation treatments described in the first preferred embodiment.

Figure 14:
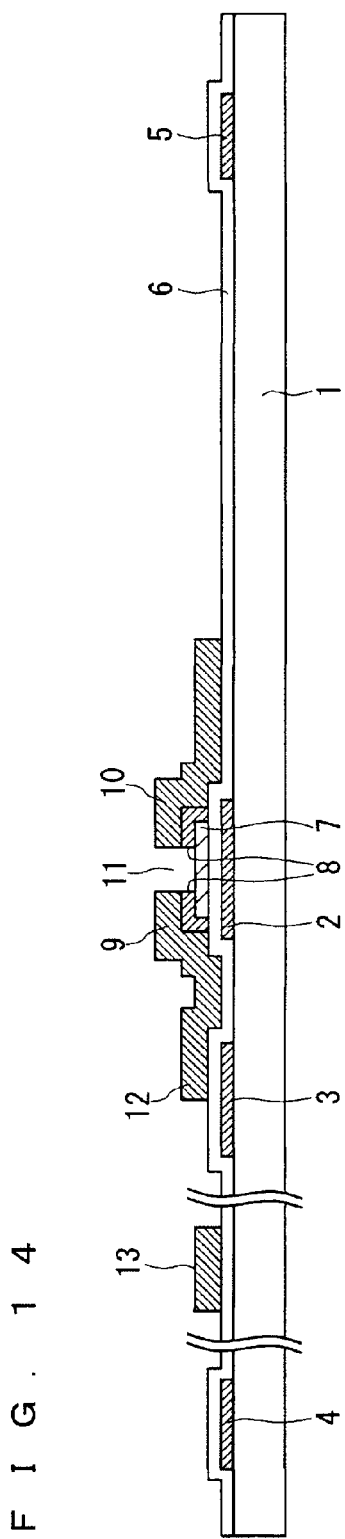

Then, through the same steps as those of the production method (including the third photolithography process) according to the first preferred embodiment described with reference to FIG. 6, as shown in FIG. 14, the source electrode 9, the drain electrode 10, the source line 12, the source terminal 13 are formed as the AlNiN film, and then the ohmic low resistance Si film 8 is partially removed to form the isolation region 11.

Thus, according to the steps shown in FIGS. 13 and 14, the ohmic low resistance Si film 8 is oxidized in the step shown in FIG. 13, and the source and drain electrodes 9 and 10 including the AlNiN film which is in contact with the ohmic low resistance Si film 8 are formed in the step shown in FIG. 14, so that nickel (Ni), oxygen (O), and nitrogen (N) are contained in the vicinity of the connection interface (third region) between the ohmic low resistance Si film 8 and each of the source and drain electrodes 9 and 10.

Thus, while the source and drain electrodes 9 and 10 are formed of the AlNiN film and nickel (Ni) and nitrogen (N) are contained in the third region in the above-described production method, the present invention is not limited to this. For example, in a case where the source and drain electrodes 9 and 10 are formed of an AlNi alloy film not containing N, after the photoresist pattern is removed in the step shown in FIG. 13, around the time of oxidation of the ohmic low resistance Si film 8, the nitridation treatment to nitride the ohmic low resistance Si film 8 may be additionally performed. In this case also, in the third region, nickel (Ni) is contained from the source and drain electrodes 9 and 10, and oxygen (O) and nitrogen (N) are contained by the oxidation treatment and nitridation treatment. In addition, as for evaluation on the TFT as will be described below, the evaluation is made on the TFT in which the nitridation treatment is additionally performed around the time of the oxidation treatment.

Figure 15:
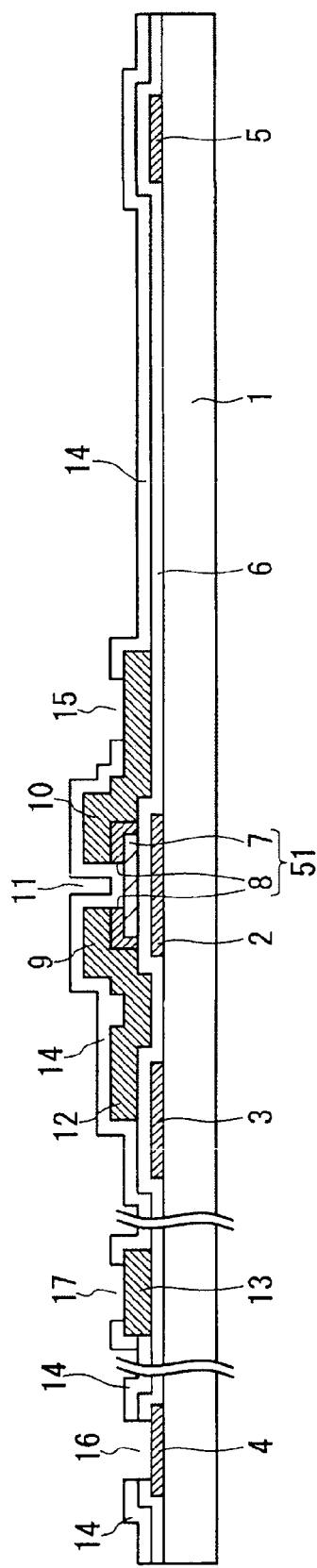

Then, through the same steps as those of the production method (including the fourth photolithography process) according to the first preferred embodiment described with reference to FIG. 7, as shown in FIG. 15, at least the pixel drain contact hole 15 reaching the surface of the drain electrode 10, the gate terminal contact hole 16 reaching the surface of the gate terminal 4, and the source terminal contact hole 17 reaching the surface of the source terminal 13 are formed in the interlayer insulation film 14.

Finally, through the same steps as those of the production method (including the fifth photolithography process) according to the first preferred embodiment described with reference to FIG. 3, as shown in FIG. 12, the transmission pixel electrode 18, the gate terminal pad 19, and the source terminal pad 20 are formed so as to be electrically connected to the drain electrode 10, the gate terminal 4, and the source terminal 13, respectively.

The TFT substrate completed as described above is subjected to a heat treatment at a temperature about 200° C. to 300° C. Through the heat treatment, static charge and stress accumulated in the whole TFT substrate can be removed or relieved, and electric specific resistance of the metal film can be lowered, whereby the TFT characteristics can be improved and stabilized. As a preferable production method example, here, the TFT substrate is subjected to the heat treatment such that the TFT substrate is held in the air at about 300° C. for 30 minutes.

<Evaluation of TFT>

Then, the barrier layer having a high N concentration is evaluated in the TFT 50 produced by the above production method. More specifically, evaluation is made on proper amounts of an O atomic weight and an N atomic weight in the vicinity of the interface (third region) between the ohmic low resistance Si film 8 and the source and drain electrodes 9 and 10.

In addition, the evaluation target TFT is formed such that after the ohmic low resistance Si film 8 has been oxidized and nitrogenized, the AlNi alloy film (source and drain electrodes 9 and 10) not containing nitrogen is formed. Then, the TFT substrate is subjected to the heat treatment in the air at 300° C. for 30 minutes, and the on characteristics and off characteristics are examined.

In addition, evaluation is separately made on electric characteristics affected by the interface between the upper surface of the ohmic low resistance Si film 8 and the Al alloy film, and electric characteristics affected by the interface between the side surface of the ohmic low resistance Si film 8 and the Al alloy film. More specifically, with respect to the former, the evaluation is made on the electric characteristics of a structure in which light from the backlight is not shielded by the gate electrode 2, that is, a structure in which the gate electrode 2 is not provided just under the interface between the side surface of the ohmic low resistance Si film 8 and the source and drain electrodes 9 and 10. Thus, with respect to the latter, the evaluation is made on the electric characteristics of a structure in which light from the backlight is shielded by the gate electrode 2, that is, a structure in which the gate electrode 2 is provided just under the interface between the ohmic low resistance Si film 8 and the source and drain electrodes 9 and 10.

Figure 16:
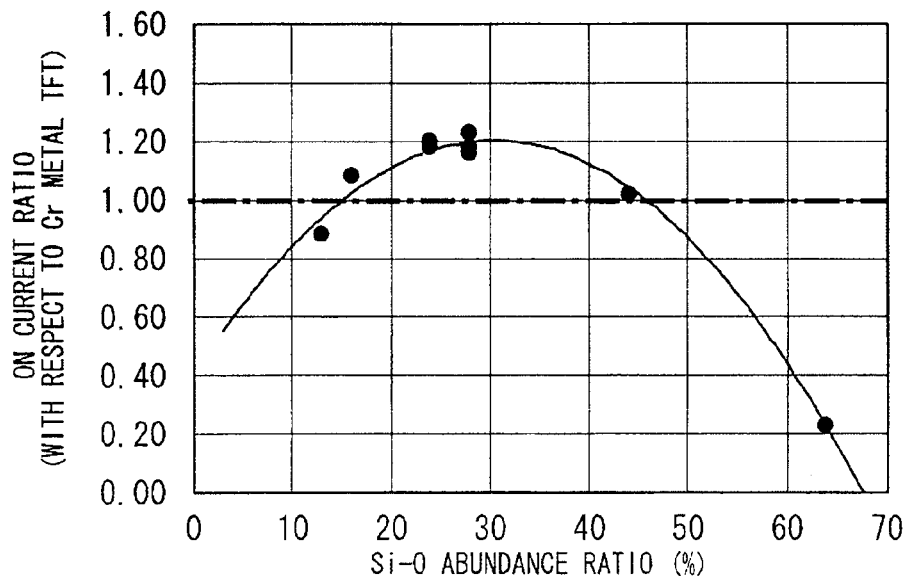
FIGS. 16 to 19 are views showing evaluation of the TFT according to the second preferred embodiment.

FIG. 16 shows a change in on characteristics with respect to the abundance ratio of the Si—O binding (O atom) of the ohmic low resistance Si film 8 (the area density of the Si—O bonding in the third region) in the evaluation target TFT in which light is not shielded. In addition, the source and drain electrodes 9 and 10 of the evaluation target TFT each include the AlNi film (Ni composition is 2 mol %) not containing nitrogen.

In FIG. 16, the on characteristics are shown by an on current ratio provided by dividing an on current value of the evaluation target TFT by an on current value of the Cr metal TFT. That is, in FIG. 16, when the on current ratio is 1 or more, it means that the on characteristics of the evaluation target TFT is superior to that of the Cr metal TFT.

In FIG. 16, as the abundance ratio of the Si—O binding increases to about 30%, the on current ratio increases. This is because the Si—O binding prevents a compound reaction and a mutual diffusion reaction between the Al atom and the Ni atom of the source and drain electrodes 9 and 10, and the Si atom of the ohmic low resistance Si film 8. However, when the abundance ratio of the Si—O binding exceeds about 30%, the Al atom and the O atom are bound and an aluminum oxide layer having high resistance is formed, so that the on current ratio decreases. Since there is such relationship between the Si—O binding and the on characteristics, the area density of the Si—O binding is preferably within a range of 15% to 45%, more preferably 30%, in the third region, in order to obtain the on current value which is the same or more than that of the standard Cr metal TFT (on current ratio is 1 or more).

Figure 17:
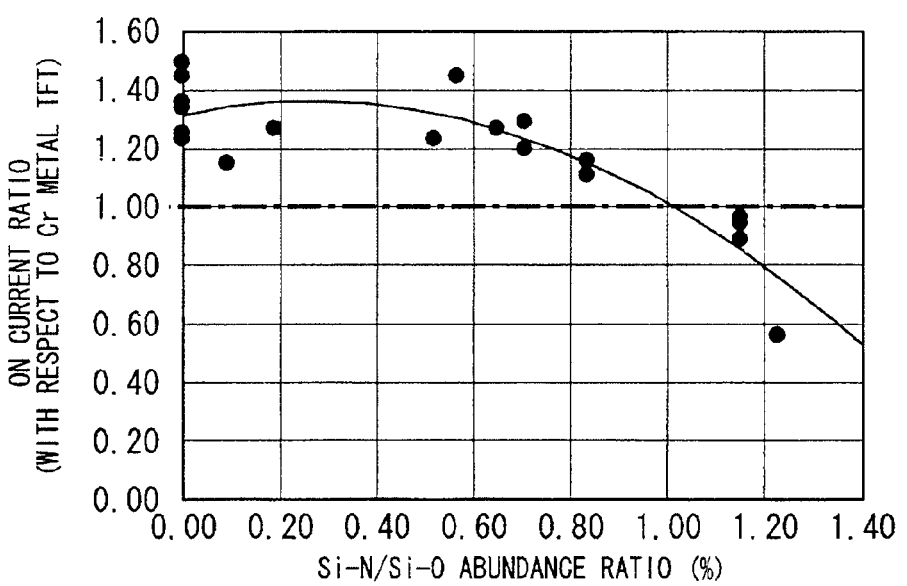

FIG. 17 shows a relationship of the on current ratio with respect to a ratio of (Si—N binding)/(Si—O binding) in the case where the N atom (Si—N binding) is contained under the condition that the abundance ratio of the Si—O binding is 15% to 45%, in the vicinity of the interface (third region) between the ohmic low resistance Si film 8 and the source and drain electrodes 9 and 10 in the evaluation target TFT. Here, the ratio of (Si—N binding)/(Si—O binding) means a ratio of (area density of the Si—N binding)/(area density of the Si—O binding). As shown in FIG. 17, when the ratio of (Si—N binding)/(Si—O binding) exceeds 1, the on current ratio become 1 or less, so that the on current value of the evaluation target TFT becomes lower than that of the standard Cr metal TFT. Therefore, the ratio of (Si—N binding)/(Si—O binding) is preferably 1 or less, more preferably 0.2 to 0.4 in the third region.

Figure 18:
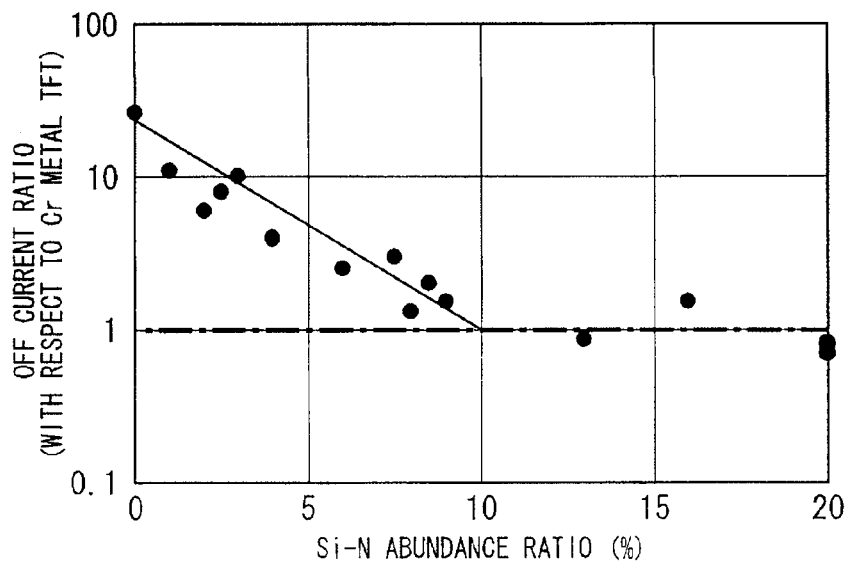

FIG. 18 shows a change in off characteristics with respect to the abundance ratio of the Si—N binding of the upper surface of the ohmic low resistance Si film 8 (area density of the Si—N binding in the third region), in the evaluation target TFT in which light is not shielded. In FIG. 18, the off characteristics are shown by an off current ratio provided by dividing an off current value of the evaluation target TFT by an off current value of the Cr metal TFT. That is, in FIG. 18, when the off current ratio is 1 or more, it means that the off characteristics of the evaluation target TFT is superior to that of the Cr metal TFT.

In FIG. 18, when the abundance ratio of the Si—N binding is 10% or less, a mutual diffusion reaction proceeds between the Al atom of the source and drain electrodes 9 and 10 and the Si atom of the ohmic low resistance Si film 8, so that the off current ratio is high. Therefore, the area density of the Si—N binding is preferably about 10% or more in the third region.

Figure 19:
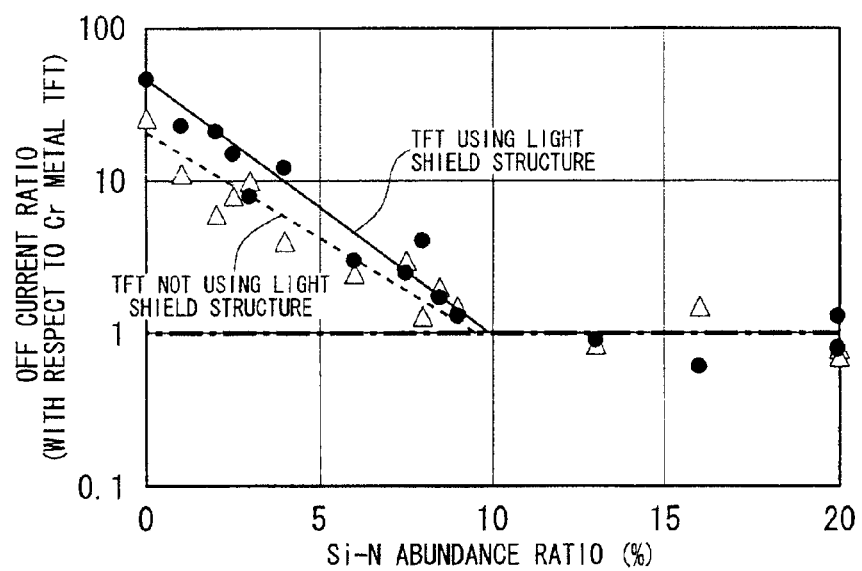

FIG. 19 shows a change in off characteristics with respect to the abundance ratio of the Si—N binding of the side surface of the ohmic low resistance Si film 8 (area density of the Si—N binding in the third region), in the evaluation target TFT in which light is shielded. As shown in FIG. 19, the area density of the Si—N binding is preferably 10% or more in the third region similar to FIG. 18.

According to the TFT 50 in this preferred embodiment, nitrogen (N) is contained in the vicinity of the interface (third region) between the ohmic low resistance Si film 8 and the source and drain electrodes 9 and 10. In this configuration, even when the high melting point metal burrier layer is not provided, the preferable off characteristics (off current ratio) after the high-temperature heat treatment are obtained. Especially, when the area density of the Si—N binding is 10% or more in the third region, the off characteristics in the TFT 50 not having the high melting metal burrier layer according to this preferred embodiment can be the same as that of the TFT having the high melting point metal burrier layer. In addition, according to this preferred embodiment, since the nitridation treatment on the side surface of the semiconductor layer 51 which is performed in the first preferred embodiment can be omitted, the production method can be simplified.

In addition, according to the TFT 50 in this preferred embodiment, nickel (Ni) and oxygen (O) are additionally contained in the third region. In this configuration, even when the high melting metal burrier layer is not provided, the preferable on characteristics (on current ratio) after the high-temperature heat treatment are obtained. Especially, when the area density of the Si—O binding is within a range of 15 to 45%, and the ratio of (Si—N binding)/(Si—O binding) is 1 or less in the third region, the on characteristics can be more favorable than that of the semiconductor device having the high melting metal burrier layer.

<Third Preferred Embodiment>

A description will be made of a third preferred embodiment assuming that the semiconductor device according to the present invention is the TFT 50 similar to the first preferred embodiment described above. According to the TFT substrate in this preferred embodiment, a time for the $N_2$ plasma nitridation treatment can be reduced, and a load of steps can be reduced compared with the first preferred embodiment. Hereinafter, while the TFT substrate according to this preferred embodiment will be described, the same reference as that of the first preferred embodiment is allotted to the same component, and a part different from the first preferred embodiment will be mainly described.

Figure 20:
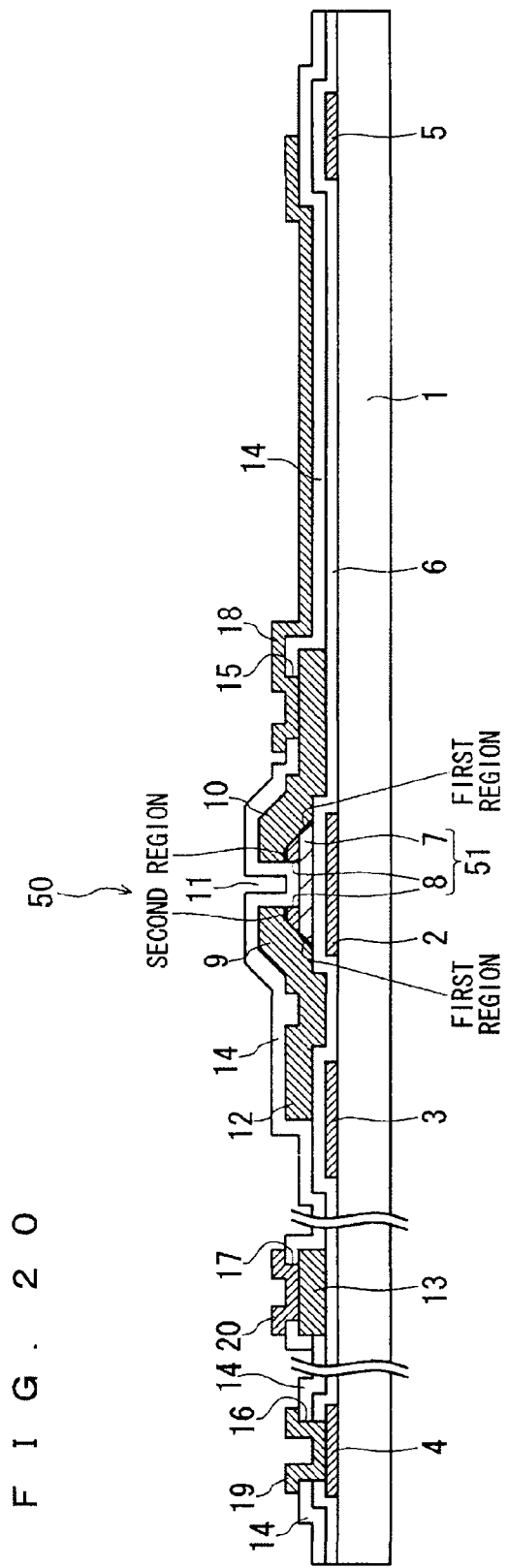
FIG. 20 is a cross-sectional view showing a TFT array substrate according to a third preferred embodiment.

A planar structure of the TFT substrate according to this preferred embodiment is the same as the planar structure of the TFT substrate shown in FIG. 2. FIG. 20 is a cross-sectional view showing a structure of the TFT substrate according to this preferred embodiment, in which the A-A cross section, the B-B cross section, and the C-C cross section in FIG. 2 are shown side by side, similar to FIG. 3.

The TFT 50 according to this preferred embodiment shown in FIGS. 2 and 20 includes the transparent substrate 1, the gate electrode 2, the gate insulation film 6, the semiconductor layer 51, the source electrode 9, the drain electrode 10, and the interlayer insulation film 14.

The semiconductor layer 51 according to this preferred embodiment includes the Si semiconductor active film 7 (first amorphous silicon film) and the ohmic low resistance Si film 8 having an n-type conductivity and covering the Si semiconductor active film 7 except for the isolation region 11 being formed on the gate electrode 2 with the gate insulation film 6 interposed between the gate electrode 2 and the semiconductor layer 51, and an etching end face of the semiconductor layer 51 is tapered as a whole. That is, the Si semiconductor active film 7 has the tapered etching end face in the vicinity of an interface (first region) between the side surface of the Si semiconductor active film 7 and the source and drain electrodes 9 and 10, and the ohmic low resistance Si film 8 has the tapered etching end face in the vicinity of an interface between the side surface of the ohmic low resistance Si film 8 and the source and drain electrodes 9 and 10. In addition, the source and drain electrodes 9 and 10 according to this preferred embodiment includes the Al alloy film containing at least aluminum (Al), and directly connected only to the ohmic low resistance Si film 8 of the semiconductor layer 51.

Thus, according to the TFT 50 in the preferred embodiment, as will be described below, at least nickel (Ni), oxygen (O), and nitrogen (N) are contained in the vicinity of the interface between the ohmic low resistance Si film 8 and the source and drain electrodes 9 and 10 by performing the nitridation treatment and the like on the ohmic low resistance Si film 8.

Here, "in the vicinity of the interface" and "in the vicinity of the connection interface" means a region on the side of the interface from at least a half of a film thickness, depending on a condition such as a film thickness adjacent to the interface. In addition, the second region only has to be provided in the vicinity of the interface between an upper surface of the ohmic low resistance Si film 8 and the source and drain electrodes 9 and 10, and it may be provided or may not be provided in the vicinity of the interface between a side surface of the ohmic low resistance Si film 8 and the source and drain electrodes 9 and 10. In addition, the Si-based film (Si film, or a film containing Si more than another atom, and the Si semiconductor active film 7 in this case) and the Al alloy film (source and drain electrodes 9 and 10) may be connected in such a manner that the Si-based film and the Al alloy film are partially connected to each other.

The TFT 50 according to this preferred embodiment has the same on characteristics and off characteristics as those of the TFT according to the first preferred embodiment, and the nitridation treatment time on the side surface of the ohmic low resistance Si film 8 (semiconductor layer 51, here) can be shorter than that of the first preferred embodiment. It is supposed that this effect can be obtained because nitrogen can be effectively contained at the time of nitridation treatment with nitrogen plasma due to the tapered configuration of the side surface of the ohmic low resistance Si film 8 (semiconductor layer 51).

<Method for Producing TFT Substrate According to Third Preferred Embodiment>

Next, a description will be made of steps of a method for producing the TFT substrate having the TFT 50 having the above effect according to a third preferred embodiment mainly with respect to a part different from the first preferred embodiment.

First, through the same steps as those of the production method (including the first photolithography process) according to the first preferred embodiment described with reference to FIG. 4, the gate electrode 2, the gate line 3, the gate terminal 4, and the auxiliary capacity electrode 5 are formed on the transparent insulation substrate 1.

Figure 21:
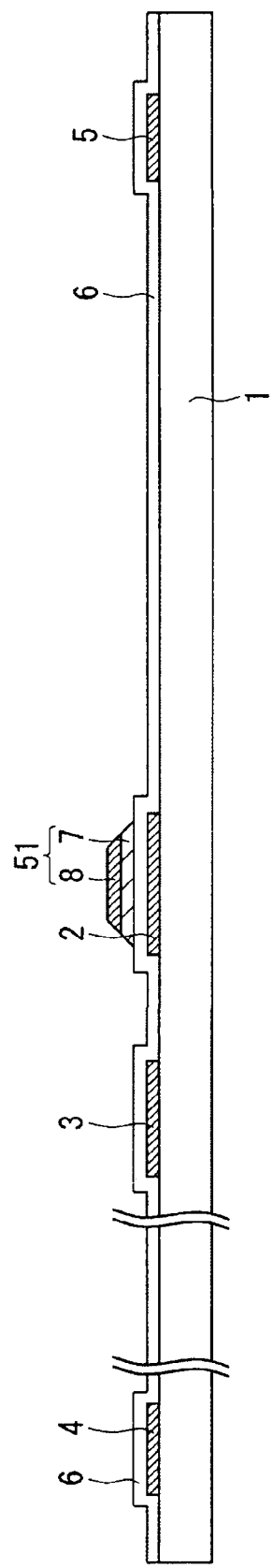
FIGS. 21 to 23 are cross-sectional views showing method for producing the TFT array substrate according to the third preferred embodiment.

Then, referring to FIG. 21, the gate insulation film 6 including the SiN film, and a a-Si film which will become the Si semiconductor active film 7 and the ohmic low resistance Si film 8 are sequentially formed.

As a preferable production method example, here, the CVD method is used and the SiN film having a thickness of 400 nm and the a-Si film having a thickness of 200 nm are sequentially formed under a substrate heating condition at about 300° C.

Then, the a-Si film and n+a-Si film are patterned by a second photolithography process such that the etching end face is tapered to form the semiconductor layer 51 (the Si semiconductor active film 7 and the ohmic low resistance Si film 8). Thus, the structure shown in FIG. 21 can be obtained. According to this preferred embodiment, a photoresist pattern is formed by the photolithography and then the a-Si film and n+a-Si film are etched by the well-known dry etching method using a mixture gas including a fluorine series gas and an oxygen gas so that the etching end face is tapered, whereby the semiconductor layer 51 (the Si semiconductor active film 7 and the ohmic low resistance Si film 8) serving as the component of the TFT 50 is formed.

Then, the side surface of the Si semiconductor active film 7 and the side surface of the ohmic low resistance Si film 8 are subjected to the nitridation treatment with the photoresist pattern remained on the ohmic low resistance Si film 8.

In the first preferred embodiment, as the preferable production method example, the nitridation treatment is performed for 5 minutes in the parallel plate type plasma generation device under the condition that the substrate temperature is set at room temperature, the pressure is set at 50 Pa, the frequency is set at 13.56 MHz, the power density is set at 0.5 W/cm$^2$, and the N$_2$ gas flow rate is set at 100 sccm. Meanwhile, according to the third preferred embodiment, the nitridation treatment time is reduced to 2 minutes. An element distribution state of the side surface of the Si semiconductor active film 7 actually formed by the above treatment is analyzed by the energy dispersive X-ray spectroscopy (TEM-EDX), and it is found that an area density of Si—N binding (binding of a Si atom and a N atom) is 46.8% which is almost the same as that of the first preferred embodiment although the treatment time is reduced.

In addition, other than this analysis, the side surface of the above Si semiconductor active film 7 is measured by the SIMS (Secondary Ion Mass Spectrometer), and it is confirmed that a nitrogen containing layer of the Si semiconductor active film 7 is formed to be 5 nm in thickness from the side surface of the Si semiconductor active film 7.

While the nitrogen containing layer is formed by the N$_2$ plasma treatment in the preferable production method example, a desired nitrogen containing layer can be also obtained by a heating treatment in an atmosphere containing the N atom, or N atom ion injection instead of the above method, which has been confirmed by experiments. Thus, since each of the treatments as described above can nitrogenize the side surface of the Si semiconductor active film 7 and the side surface of the ohmic low resistance Si film 8, the nitridation treatment can be performed by combining the above treatments as well as by each treatment.

Figure 22:
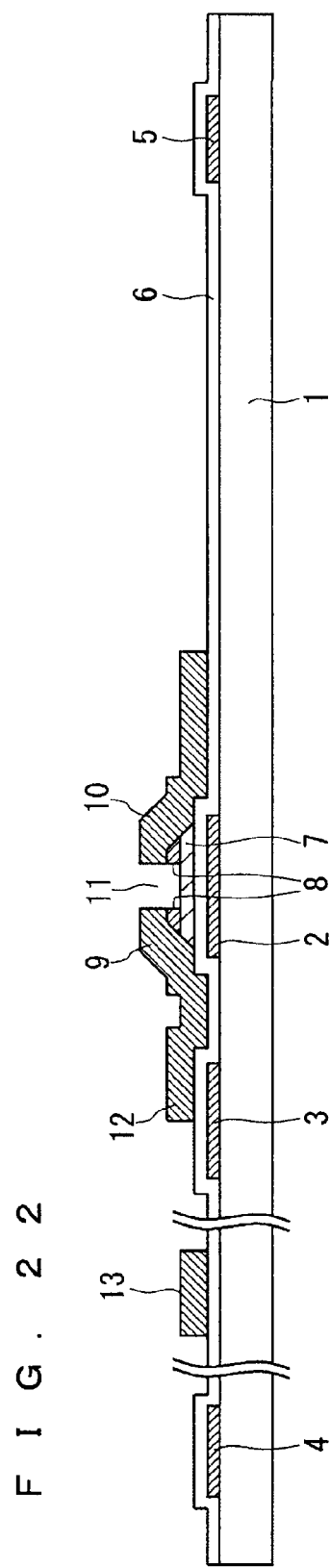

Then, through the same steps as those of the production method (including the third photolithography process) according to the first preferred embodiment described with reference to FIG. 6, as shown in FIG. 22, the source electrode 9, the drain electrode 10, the source line 12, and the source terminal 13 are formed of the AlNiN film, and then the ohmic low resistance Si film 8 is partially removed to form the isolation region 11.

Here, according to the steps shown in FIGS. 21 and 22, the side surface of the Si semiconductor active film 7 which has been etched so as to be tapered is nitrogenized in the step shown in FIG. 21, and the source and drain electrodes 9 and 10 which is in contact with the side surface of the Si semiconductor active film 7 are formed in the step shown in FIG. 22, so that nitrogen (N) is contained in the vicinity of the connection interface (first region) between the side surface of the Si semiconductor active film 7 and the source and drain electrodes 9 and 10. In addition, the ohmic low resistance Si film 8 is oxidized in the step shown in FIG. 21, and the source and drain electrodes 9 and 10 including the AlNiN film which is in contact with the ohmic low resistance Si film 8 are formed in the step shown in FIG. 22, so that nickel (Ni), oxygen (O), and nitrogen (N) are contained in the vicinity of the interface (second region) between the ohmic low resistance Si film 8 and the source and drain electrodes 9 and 10. Here, according to this preferred embodiment, it is assumed that a content rate of nitrogen (N) in the first region is higher than a content rate of nitrogen (N) of the second region.

Thus, while the source and drain electrodes 9 and 10 include the AlNiN film, and nickel (Ni) and nitrogen (N) are contained in the second region by the above-described production method, the present invention is not limited to this. For example, in a case where the source and drain electrodes 9 and 10 each include an AlNi alloy film not containing N, after the photoresist pattern is removed in the step shown in FIG. 21, around the time of the oxidation treatment of the Si semiconductor active film 7 and the ohmic low resistance Si film 8, the nitridation treatment may be additionally performed. In this case also, in the second region, nickel (Ni) is contained from the source and drain electrodes 9 and 10, and oxygen (O) and nitrogen (N) are contained by the oxidation treatment and the nitridation treatment.

Figure 23:
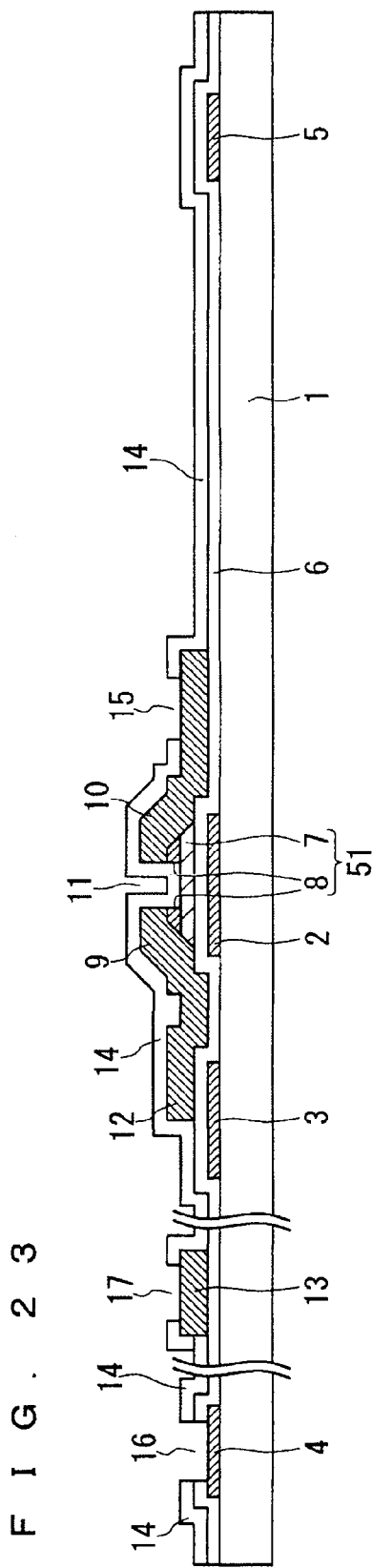

Then, through the same steps as those of the production method (including the fourth photolithography process) according to the first preferred embodiment described with reference to FIG. 7, as shown in FIG. 23, the interlayer insulation film 14 is formed in which at least the pixel drain contact hole 15 reaching the surface of the drain electrode 10, the gate terminal contact hole 16 reaching the surface of the gate terminal 4, and the source terminal contact hole 17 reaching the surface of the source terminal 13 are formed.

Finally, through the same steps as those of the production method (including the fifth photolithography process) according to the first preferred embodiment described with reference to FIG. 3, as shown in FIG. 20, the transmission pixel electrode 18, the gate terminal pad 19, and the source terminal pad 20 are formed so as to be electrically connected to the drain electrode 10, the gate terminal 4, and the source terminal 13, respectively.

The TFT substrate completed as described above is subjected to a heat treatment at a temperature about 200° C. to 300° C. Through the heat treatment, static charge and stress accumulated in the whole TFT substrate can be removed or relieved, and electric specific resistance of the metal film can be lowered, whereby the TFT characteristics can be improved and stabilized. As a preferable production method example, here, the TFT substrate is subjected to the heat treatment such that the TFT substrate is held in the air at about 300° C. for 30 minutes.

In the TFT 50 produced by the above production method, evaluation is made on proper amounts of O atomic weight and a N atomic weight in the vicinity of the interface (second region) between the ohmic low resistance Si film 8 and the source and drain electrodes 9 and 10, and evaluation is made on a proper amount of N atomic weight in the vicinity of the interface (first region) between the side surface of the Si semiconductor active film 7 and the source and drain electrodes 9 and 10, and it is found that the same effect as that of the first preferred embodiment is provided.

According to the TFT 50 in this preferred embodiment, nitrogen (N) is contained in the vicinity of the interface (first region) between the side surface of the Si semiconductor active film 7 etched so as to be tapered and the source and drain electrodes 9 and 10. In this configuration, even though the nitridation treatment time for the first region is reduced compared with the first preferred embodiment, the same off characteristics (off current ratio) as those of the first preferred embodiment can be obtained.

<Summary of First to Third Preferred Embodiments>

The present invention provides the Al alloy film which is directly connected to the Si film or the Si-based film and shows preferable contact characteristics in the above semiconductor device, and the method for producing it. Thus, even when the semiconductor device has the structure in which the Al alloy film and Si film or Si-based film are directly connected, the semiconductor device can show the contact characteristics which is the same or more than that of the semiconductor device having the high melting point burrier layer between those films. More specifically, the source electrode and the drain electrode (Al alloy film) of the semiconductor device have preferable contact characteristics with the oxide transparent conductive film such as the ITO film, and the Si film or the Si-based film, and heat resistance. Thus, since the step of forming the high melting point metal burrier layer is omitted, the method for producing the semiconductor device can be simplified.

Thus, in the case where the high melting point metal burrier layer is omitted, a width of the metal line such as the source line 12 or the drain electrode 10 can be miniaturized, so that the semiconductor device can be miniaturized. Meanwhile, in a case where the width of the metal line such as the source line 12 or the drain electrode 10 is not changed, the resistance can be lowered, whereby power consumption of the semiconductor device can be cut (energy can be saved).

In addition, in the case where the high melting point metal burrier layer is omitted, the semiconductor device can be easily separated. In addition, since a poisonous metal such as Cr is not used, the semiconductor device can be safely produced.

In addition, since the Al alloy film can be used for the line such as the source electrode 9, the drain electrode 10, and the source line 12 of the active matrix type TFT substrate for the display, line resistance can be lowered, and the TFT has preferable on characteristics, off characteristics, and heat resistance. Therefore, a high quality display having no display unevenness and no display defect caused by a signal delay can be effectively produced at low cost, in a large display or a small and fine display. Thus, according to the above preferred embodiment, production capability can be increased in the display device requiring the low resistance line.

In addition, even when the above Al alloy film is used for the source electrode 9 and the drain electrode 10 of the TFT structure in which the light from the backlight is shielded, the TFT shows preferable off characteristics. Therefore, a high quality display having no display defect can be produced in a liquid crystal display having high brightness.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a gate electrode formed on an insulation substrate;
a semiconductor layer including a first amorphous silicon film and a second amorphous silicon film having a predetermined conductivity type, being formed in this order on said gate electrode with a gate insulation film interposed between said gate electrode and said semiconductor layer, the first amorphous silicon film having an upper surface and a side surface, the side surface extending in a direction which intersects a direction in which the upper surface extends; and
source and drain electrodes directly connected to said semiconductor layer and containing at least aluminum (Al), wherein
said semiconductor layer is formed on an inner side of an outer periphery of said gate electrode in a planar view, and
at least nitrogen (N) is contained in a first region formed within said first amorphous silicon film at an interface between said side surface of said first amorphous silicon film and said source and drain electrodes.

2. The semiconductor device according to claim 1, wherein
at least nickel (Ni), oxygen (O), and nitrogen (N) are contained in a second region formed within said second amorphous silicon film at an interface between said second amorphous silicon film and said source and drain electrodes.

3. The semiconductor device according to claim 2, wherein
an area density of Si—O binding is within a range of 15 to 45% and a ratio of (Si—N binding)/(Si—O binding) is 1 or less, in said second region.

4. The semiconductor device according to claim 3, wherein said source and drain electrodes further contain nickel (Ni).

5. The semiconductor device according to claim 2, wherein
an area density of Si—N binding is 10% or more in said second region.

6. The semiconductor device according to claim 2, wherein
a content rate of nitrogen (N) in said first region is higher than a content rate of nitrogen (N) in said second region.

7. The semiconductor device according to claim 2, wherein
the first region is a region having a thickness of 5 nm measured from the side surface of the first amorphous silicon layer, and
the second region is a region having a thickness of 10 nm measured from a surface of the second amorphous silicon layer.

8. The semiconductor device according to claim 1, wherein
an area density of Si—N binding is 45% or more in said first region.

9. The semiconductor device according to claim 1, wherein said first amorphous silicon film has a tapered etching end face in said first region.

10. The semiconductor device according to claim 1, wherein the first region was formed via a nitridation treatment of the semiconductor layer.

11. The semiconductor device according to claim 2, wherein the first region and the second region were formed via a nirtidation treatment of the semiconductor layer.

12. The semiconductor device according to claim 1, wherein the first region is a region having a thickness of 5 nm from the side surface of the first amorphous silicon layer.

13. A semiconductor device comprising:
a gate electrode formed on an insulation substrate;
a semiconductor layer including a first amorphous silicon film and a second amorphous silicon film covering said first amorphous silicon film and having a predetermined conductivity type, being formed on said gate electrode with a gate insulation film interposed between said gate electrode and said semiconductor layer, the second amorphous silicon film having an upper surface and a side surface, the side surface extending in a direction which intersects a direction in which the upper surface extends; and source and drain electrodes directly connected to only said second amorphous silicon film of said semiconductor layer and containing at least aluminum (Al), wherein said semiconductor layer is formed on an inner side of an outer periphery of said gate electrode in a planar view, and at least nitrogen (N) is contained in a region formed within said second amorphous silicon film at an interface between at least said side surface of said second amorphous silicon film and said source and drain electrodes.

14. The semiconductor device according to claim 13, wherein
at least nickel (Ni) and oxygen (O) are further contained in said region.

15. The semiconductor device according to claim 14, wherein
an area density of Si—O binding is within a range of 15 to 45% and a ratio of (Si—N binding)/(Si—O binding) is 1 or less, in said region.

16. The semiconductor device according to claim 14, wherein
an area density of Si—N binding is 10% or more in said region.

17. A display device comprising:
a semiconductor device;
said semiconductor device comprising:
a gate electrode formed on an insulation substrate;
a semiconductor layer including a first amorphous silicon film and a second amorphous silicon film having a predetermined conductivity type, being formed in this order on said gate electrode with a gate insulation film interposed between said gate electrode and said semiconductor layer, the first amorphous silicon film having an upper surface and a side surface, the side surface extending in a direction which intersects a direction in which the upper surface extends; and
source and drain electrodes directly connected to said semiconductor layer and containing at least aluminum (Al), wherein
said semiconductor layer is formed on an inner side of an outer periphery of said gate electrode in a planar view, and
at least nitrogen (N) is contained in a first region formed within said first amorphous silicon film at an interface between said side surface of said first amorphous silicon film and said source and drain electrodes.

\* \* \* \* \*